US012813180B2

(12) United States Patent
Tanaka et al.

(10) Patent No.: US 12,813,180 B2
(45) Date of Patent: Nov. 24, 2026

(54) BEAM DAMPER HAVING A MUTI-MEMBER WITH AN EAVES PORTION

(71) Applicant: JSW Aktina System Co., Ltd., Yokohama (JP)

(72) Inventors: Hiroya Tanaka, Yokohama (JP); Suk-hwan Chung, Yokohama (JP); Tamotsu Odajima, Yokohama (JP); Daisuke Ito, Yokohama (JP)

(73) Assignee: JSW Aktina System Co., Ltd., Yokohama (JP)

( * ) Notice: Subject to any disclaimer, the term of this patent is extended or adjusted under 35 U.S.C. 154(b) by 580 days.

(21) Appl. No.: 18/035,775

(22) PCT Filed: Nov. 5, 2021

(86) PCT No.: PCT/JP2021/040818
§ 371 (c)(1),
(2) Date: May 8, 2023

(87) PCT Pub. No.: WO2022/102538
PCT Pub. Date: May 19, 2022

(65) Prior Publication Data

US 2023/0411159 A1 Dec. 21, 2023

(30) Foreign Application Priority Data

Nov. 11, 2020 (JP) ................................ 2020-187793

(51) Int. Cl.
*H10P 34/42* (2026.01)
*B23K 26/064* (2014.01)
(Continued)

(52) U.S. Cl.
CPC ........... *H10P 34/42* (2026.01); *B23K 26/064* (2015.10); *B23K 26/127* (2013.01);
(Continued)

(58) Field of Classification Search
CPC ......................... B23K 26/064; B23K 2101/40; B23K 26/704; B23K 26/127; H01L 21/268;
(Continued)

(56) References Cited

U.S. PATENT DOCUMENTS 11,964,342 B2 * 4/2024 Shimoji .............. B23K 26/083
2003/0024905 A1 2/2003 Tanaka
(Continued)

FOREIGN PATENT DOCUMENTS

JP 2003-080390 A 3/2003
JP 2003-151916 A 5/2003
(Continued)

OTHER PUBLICATIONS

International Search Report for PCT/JP2021/040818 dated Dec. 21, 2021.

(Continued)

*Primary Examiner* — Alonzo Chambliss
(74) *Attorney, Agent, or Firm* — Sughrue Mion, PLLC

(57) ABSTRACT

A laser irradiation apparatus according to an embodiment includes an optical module which irradiates an object with laser light so as to form a linear irradiation region along a first direction and a beam damper which absorbs reflected light having been reflected by the object. The beam damper includes a member and a member fixed to the member. The member includes an eaves portion having an opening portion through which the reflected light passes. The eaves portion has a reflection surface which reflects, toward an internal space enclosed by the member and the member, reflected light having been reflected by the object.

14 Claims, 15 Drawing Sheets

(51) Int. Cl.

| | |
|---|---|
| ***B23K 26/12*** | (2014.01) |
| ***B23K 26/70*** | (2014.01) |
| ***B23K 101/40*** | (2006.01) |
| ***H10P 14/20*** | (2026.01) |
| ***H10P 72/00*** | (2026.01) |
| ***H10P 95/90*** | (2026.01) |

(52) U.S. Cl.

CPC ........ *B23K 26/704* (2015.10); *H10P 14/3808* (2026.01); *H10P 72/0436* (2026.01); *H10P 95/90* (2026.01); *B23K 2101/40* (2018.08)

(58) Field of Classification Search

CPC .. H01L 21/324; H01L 21/67115; H10P 34/42; H10P 95/90; H10P 72/0436; H10P 14/3808; G02B 17/002

See application file for complete search history.

(56) References Cited

U.S. PATENT DOCUMENTS

| | | | |
|---|---|---|---|
| 2016/0259096 | A1 | 9/2016 | Murakami et al. |
| 2019/0198322 | A1 | 6/2019 | Ito et al. |

FOREIGN PATENT DOCUMENTS

| | | | | | |
|---|---|---|---|---|---|
| JP | 2005140964 | A | * | 6/2005 | |
| JP | 2016-161786 | A | | 9/2016 | |
| JP | 2018060927 | A | * | 4/2018 | ......... B23K 26/0643 |

OTHER PUBLICATIONS

Communication dated Jul. 1, 2025 in Korean Application No. 10-2023-7015822.

* cited by examiner

BEAM DAMPER HAVING A MUTI-MEMBER WITH AN EAVES PORTION

CROSS REFERENCE TO RELATED APPLICATIONS

This application is a National Stage of International Application No. PCT/JP2021/040818 filed Nov. 5, 2021, claiming priority based on Japanese Patent Application No. 2020-187793 filed Nov. 11, 2020.

TECHNICAL FIELD

The present invention relates to a laser irradiation apparatus and to a method of manufacturing a semiconductor apparatus.

BACKGROUND ART

A laser annealing apparatus which irradiates an amorphous film formed on a silicon substrate, a glass substrate, or the like with laser light to crystallize the amorphous film is known. Patent Literature 1 discloses a laser annealing apparatus which causes laser light to pass through a slit in order to block ends where intensity decreases on a cross section perpendicular to an optical axis of the laser light and which uses laser light with uniform intensity as irradiating light.

CITATION LIST

Patent Literature

Patent Literature 1: Japanese Unexamined Patent Application Publication No. 2018-60927

SUMMARY OF INVENTION

The laser annealing apparatus disclosed in Patent Literature 1 includes a blocking plate on which a slit is formed and a reflected light receiving member which absorbs reflected light having been reflected by the blocking plate. A multi-layer heat absorbing film is used as the reflected light receiving member.

In such a laser annealing apparatus, a temperature of an optical module rises due to reflected light having been reflected by the slit or a substrate. Due to the rise in the temperature of the optical module, a positional displacement of each optical element occurs and causes uneven irradiation. Therefore, it is desired that such a temperature rise be suppressed.

In addition, in Patent Literature 1, reflected light is absorbed using a multi-layer absorption film. When using high-output laser light, there is a possibility that the multi-layer absorption film may become damaged or discolored. Once a multi-layer absorption film becomes damaged or discolored, absorptance of the multi-layer absorption film declines and may cause temperature to rise.

Other problems to be solved and novel features will become apparent from descriptions in the present specification and the accompanying drawings.

A laser irradiation apparatus according to an embodiment includes: an optical module configured to irradiate an object with laser light; and a beam damper configured to absorb reflected light having been reflected by the object, wherein the beam damper includes a first member and a second member fixed so as to oppose the first member, the first member includes an eaves portion into which the reflected light is incident, and the eaves portion has a reflection surface which reflects, toward an internal space enclosed by the first member and the second member, the reflected light having been reflected by the object.

A method of manufacturing a semiconductor apparatus according to an embodiment includes the steps of: (A) causing laser light to be emitted from an optical module toward a substrate on which a film including a semiconductor is formed; (B) irradiating the substrate with the laser light; and (C) causing a beam damper to receive reflected light having been reflected by the substrate among the laser light which the substrate has been irradiated with, wherein the beam damper includes a first member and a second member fixed so as to oppose the first member, the first member includes an eaves portion into which the reflected light is incident, and the eaves portion has a reflection surface which reflects, toward an internal space enclosed by the first member and the second member, the reflected light having been reflected by the substrate.

According to the embodiment described above, a laser irradiation apparatus and a method of manufacturing a semiconductor apparatus which enables irradiation of light to be performed in a stable manner can be provided.

DESCRIPTION OF EMBODIMENT

First Embodiment

A laser irradiation apparatus according to a first embodiment will be described. The laser irradiation apparatus according to the present embodiment is an apparatus which irradiates an irradiated object with laser light. The irradiated object is, for example, a substrate on which a film including a semiconductor such as an amorphous film is formed. In this case, the laser irradiation apparatus performs a laser annealing treatment of irradiating the amorphous film with laser light to crystallize the amorphous film. For example, when a laser annealing treatment is performed using an excimer laser as the laser light, the laser irradiation apparatus is used as an excimer laser annealing (ELA) apparatus.

Figure 1:
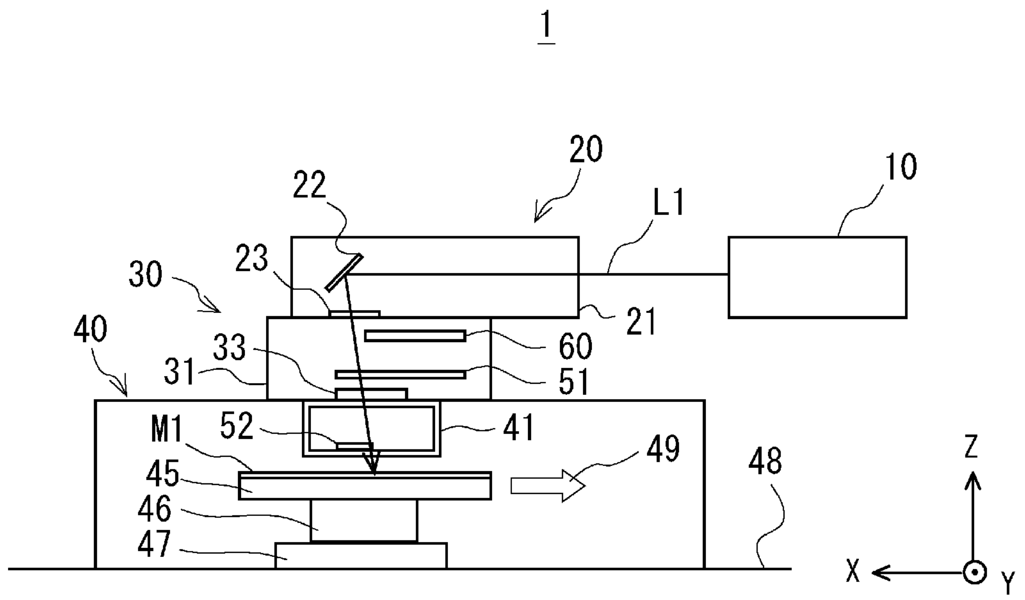
FIG. 1 is a sectional view illustrating a laser irradiation apparatus according to a first embodiment.
Figure 2:
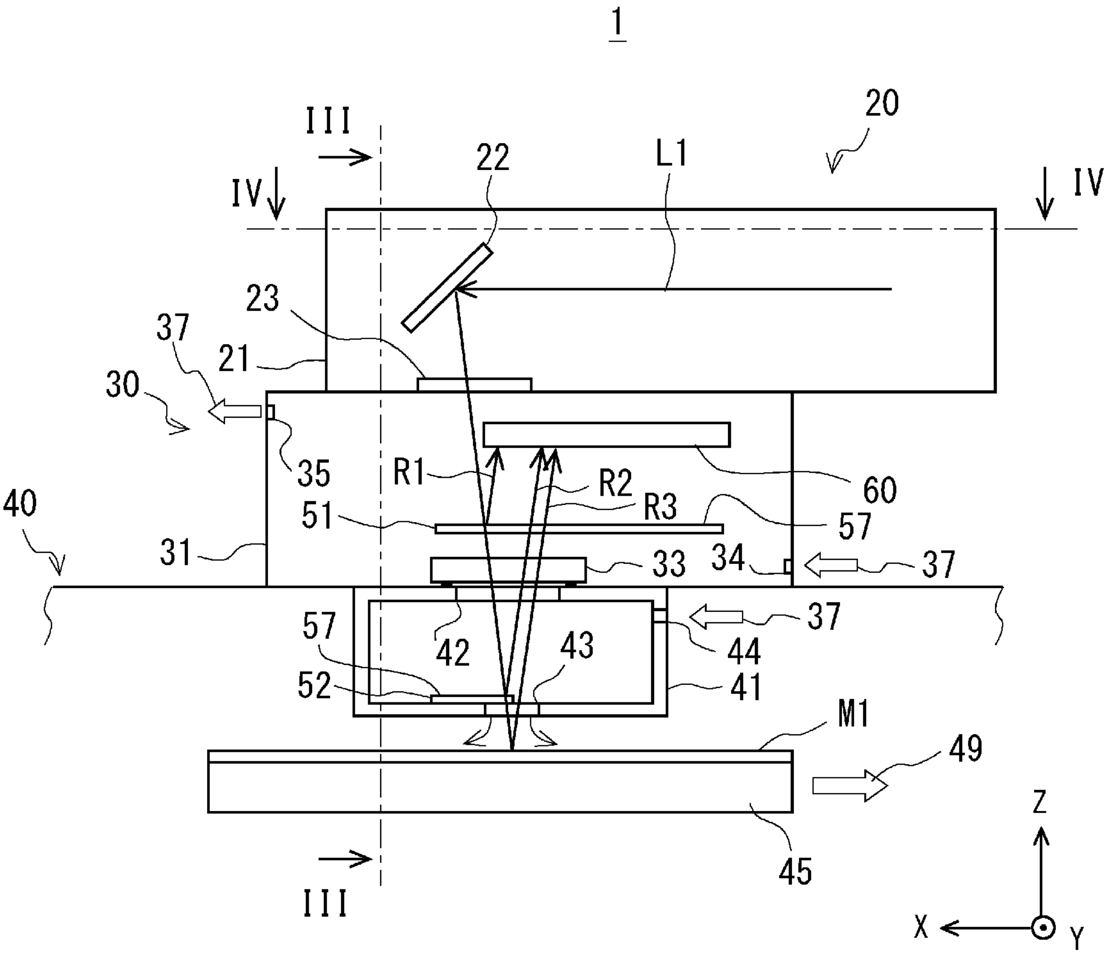
FIG. 2 is a sectional view illustrating a substantial part of the laser irradiation apparatus according to the first embodiment.
Figure 3:
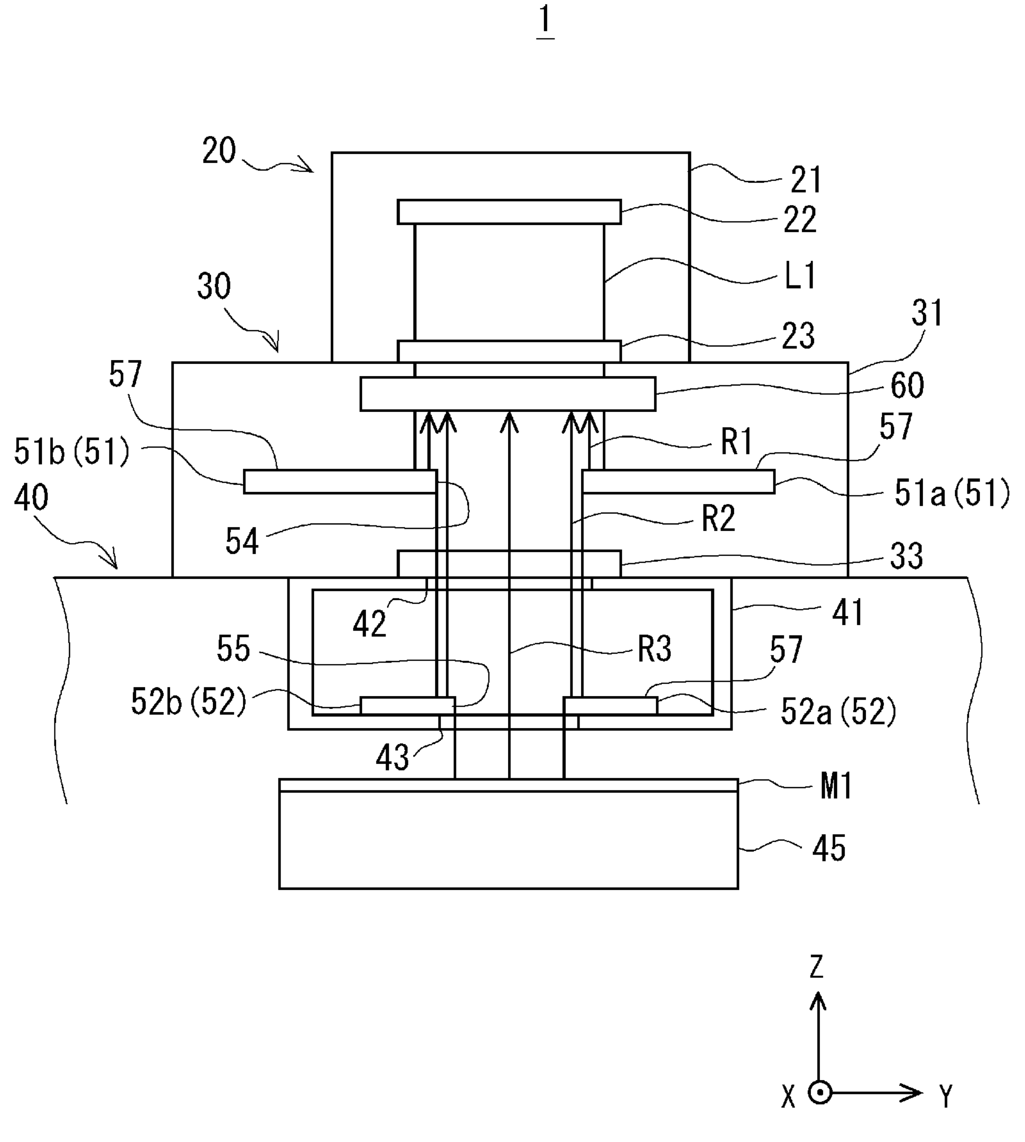
FIG. 3 is a sectional view taken along a cutting-plane line of the substantial part of the laser irradiation apparatus shown in FIG. 2.
Figure 4:
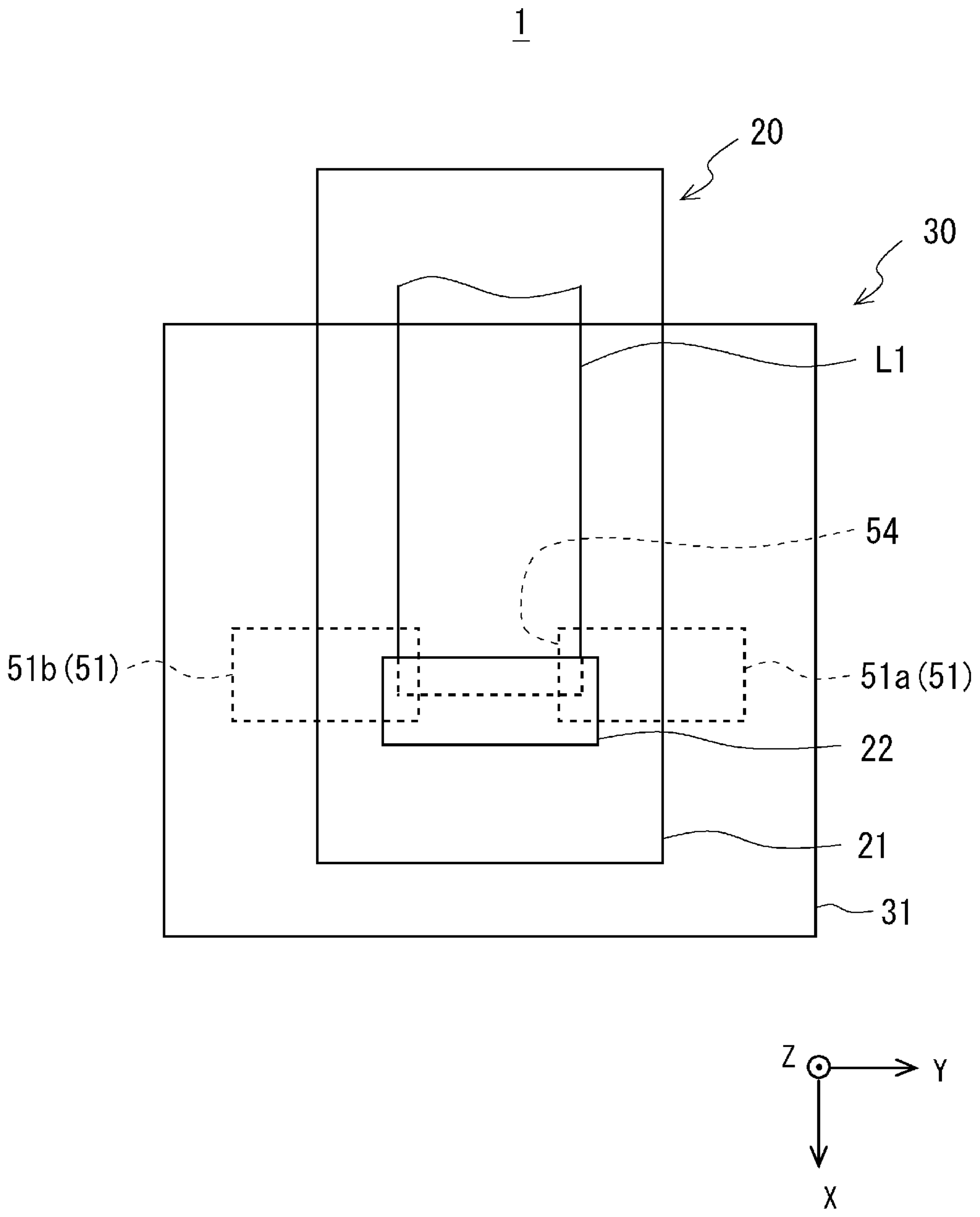
FIG. 4 is a sectional view taken along a cutting-plane line IV-IV of the substantial part of the laser irradiation apparatus shown in FIG. 2.
Figure 5:
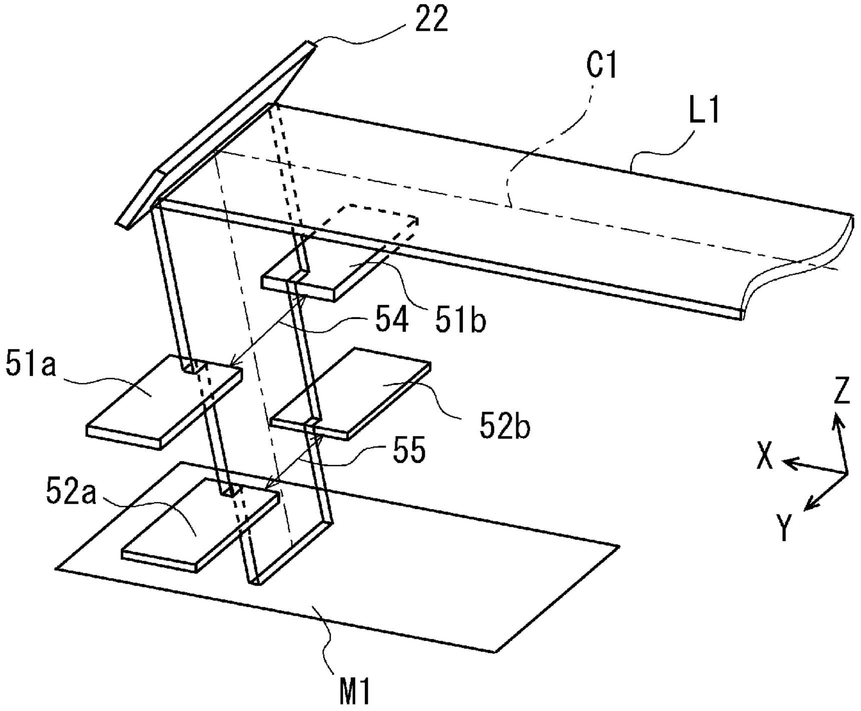
FIG. 5 is a perspective view illustrating a relationship between laser light and a slit in the laser irradiation apparatus according to the first embodiment.

First, a configuration of the laser irradiation apparatus will be described. FIG. 1 is a sectional view illustrating the laser irradiation apparatus according to the first embodiment. FIG. 2 is a sectional view illustrating a substantial part of the laser irradiation apparatus according to the first embodiment. FIG. 3 is a sectional view taken along a cutting-plane line III-III of the substantial part of the laser irradiation apparatus shown in FIG. 2. FIG. 4 is a sectional view taken along a cutting-plane line IV-IV of the substantial part of the laser irradiation apparatus shown in FIG. 2. FIG. 5 is a perspective view illustrating a relationship between laser light and a slit in the laser irradiation apparatus according to the first embodiment.

As shown in FIG. 1, a laser irradiation apparatus 1 includes a light source 10, an optical module 20, a sealed portion 30, and a treatment chamber 40. The treatment chamber 40 is provided on, for example, a flat foundation 48. The sealed portion 30 is provided above the treatment chamber 40, and the optical module 20 is provided above the sealed portion 30. The optical module 20 is provided at a position which enables laser light L1 emitted from the light source to be received.

XYZ orthogonal coordinate axes will now be introduced in order to describe the laser irradiation apparatus 1. A direction orthogonal to a top surface of the foundation 48 is assumed to be a Z-axis direction, with upward being a +Z-axis direction and downward being a −Z-axis direction. A direction connecting the light source 10 and the optical module 20 is assumed to be an X-axis direction, with a direction from the light source 10 toward the optical module 20 being a +X-axis direction and an opposite direction being a −X-axis direction. A direction orthogonal to the X-axis direction and the Z-axis direction is assumed to be a Y-axis direction, with one direction being a +Y-axis direction and an opposite direction being a −Y-axis direction.

As shown in FIG. 1, the light source 10 emits laser light L1. The light source 10 is, for example, an excimer laser light source and emits the laser light L1 being an excimer laser with a central wavelength of 308 nm. In addition, the light source 10 emits the laser light L1 which has a pulse shape. The light source 10 emits the laser light L1 toward the optical module 20. For example, the laser light L1 advances in the +X-axis direction and enters the optical module 20. When necessary, an optical element such as an attenuator for adjusting energy density may be arranged on an optical path of the laser light L1 between the light source 10 and the optical module 20.

As shown in FIGS. 1 to 4, the optical module 20 includes an optical enclosure 21 which constitutes an outer shape, a mirror 22, an optical element such as a lens, and a sealing window 23. The optical enclosure 21 is, for example, a box-shaped member constituted of a material such as aluminum. Each optical element of the optical module 20 is held inside the optical enclosure 21 by a holder or the like. Due to each of the optical elements described above, the optical module 20 adjusts an irradiation direction, an amount of light, and the like of the laser light L1 emitted from the light source 10. The sealing window 23 is provided in a part of the optical enclosure 21 such as on a lower surface of the optical enclosure 21. After being adjusted by the optical module 20, the laser light L1 is emitted from the sealing window 23 toward the sealed portion 30. In this manner, the optical module 20 irradiates the irradiated object (also referred to as an object) with the laser light L1.

As shown in FIG. 5, the laser light L1 has a line beam shape in the optical module 20. In other words, a cross section orthogonal to an optical axis C1 of the laser light L1 has an elongated linear shape which extends in one direction. For example, the cross section orthogonal to the optical axis of the laser light L1 having been reflected by the mirror 22 has a linear shape which extends in the Y-axis direction.

As shown in FIGS. 2 to 4, the sealed portion 30 has a sealing enclosure 31, a blocking plate 51, a beam damper 60, a sealing window 33, a gas inlet 34, and a gas outlet 35. In order to prevent the drawings from becoming too crowded, the gas inlet 34 and the gas outlet 35 are omitted in FIG. 3 and the beam damper 60, the sealing window 33, the gas inlet 34, and the gas outlet 35 are omitted in FIG. 4. Note that, for the sake of brevity, the respective drawings have been simplified as appropriate.

The sealing enclosure 31 is a hollow box-shaped member. The blocking plate 51 and the beam damper 60 are arranged inside the sealing enclosure 31. The gas inlet 34 and the gas outlet 35 are provided on predetermined side surfaces of the sealing enclosure 31. For example, the gas inlet 34 and the gas outlet 35 are provided on opposing side surfaces of the sealing enclosure 31. For example, the gas outlet 35 is provided above the gas inlet 34. A gas 37 such as nitrogen or another inert gas is introduced from the gas inlet 34. The gas 37 introduced into the sealing enclosure 31 from the gas inlet 34 is discharged from the gas outlet 35. The gas 37 is desirably continuously supplied to the inside of the sealing enclosure 31. In addition, the gas 37 is desirably continuously discharged to the outside of the sealing enclosure 31. A flow rate of the gas 37 is controlled to a predetermined flow rate so as to constantly keep the inside of the sealing enclosure 31 in a ventilated state.

As shown in FIGS. 2 to 5, the blocking plate 51 is arranged on an optical path on which the laser light L1 emitted from the sealing window 23 of the optical module 20 reaches the treatment chamber 40. For example, the blocking plate 51 includes a plurality of members. For example, the blocking plate 51 includes a blocking plate 51*a* and a blocking plate 51*b*. The blocking plate 51*a* and the blocking plate 51*b* are plate-shaped members which extend in one direction such as the Y-axis direction. The blocking plate 51*a* and the blocking plate 51*b* are arranged with their plate surfaces facing the Z-axis direction. The blocking plate 51*a* and the blocking plate 51*b* are arranged at intervals in the Y-axis direction. Therefore, a slit 54 is formed between the blocking plate 51*a* and the blocking plate 51*b*. Each of the blocking plates 51*a* and 51*b* is movable in the +Y-axis direction and the −Y-axis direction by a motor (not illustrated), and a width of the slit 54 (a length between the blocking plate 51*a* and the blocking plate 51*b*) can be set as appropriate. The laser light L1 passes through the slit 54. In this manner, the slit 54 through which the laser light L1 passes is formed in the blocking plate 51.

Both ends of the laser light L1 in the Y-axis direction are blocked by the blocking plate 51*a* and the blocking plate 51*b*. The ends of the laser light L1 blocked by the blocking plate 51*a* and the blocking plate 51*b* are reflected by the blocking plate 51*a* and the blocking plate 51*b* and become reflected light R1. In this manner, among the laser light L1 which the slit 54 and the blocking plate 51 are irradiated with, the laser light L1 blocked by the blocking plate 51 is reflected by the blocking plate 51. While the blocking plate 51 is shown as a flat plate which is parallel to the XY plane in FIGS. 1 to 5, the blocking plate 51 may be arranged inclined with respect to the XY plane (refer to FIG. 9).

A reflecting mirror 57 may be provided on a surface of the blocking plate 51 on the side of the optical module 20. Accordingly, absorption by the blocking plate 51 of the laser light L1 having been blocked by the blocking plate 51 can be suppressed. Therefore, a disturbance in atmosphere in the vicinity of the blocking plate 51 due to a rise in a temperature of the blocking plate 51 can be suppressed. A reflective film applied to the reflecting mirror 57 is desirably treated so as to have predetermined resistance with respect to an angle of incidence of the laser light L1. Generally, reflective films range from those with a reflectance which changes drastically depending on the angle of incidence of the laser light L1 to those with a reflectance which hardly changes due to the angle of incidence of the laser light L1. In the present embodiment, a reflective film is used which has a reflectance within a predetermined range with respect to a change in the angle of incidence of the laser light L1 which is expected when the irradiated object is irradiated with laser.

The beam damper 60 is arranged between the blocking plate 51 and the optical module 20. For example, the beam damper 60 is arranged outside the optical module 20 so that a space is formed between the beam damper 60 and the optical module 20. A detailed configuration of the beam damper 60 will be provided later. The beam damper 60 is arranged so as to be capable of receiving the reflected light R1 being the laser light L1 blocked by the blocking plate 51 and then reflected by the blocking plate 51. For example, the beam damper 60 is arranged on an optical path of the reflected light R1 in consideration of an angle of incidence of the laser light L1 and an angle of reflection of the reflected light R1.

The sealing window 33 is provided in a part of the sealing enclosure 31 such as on a lower surface of the sealing enclosure 31. The laser light L1 emitted from the sealing window 23 of the optical module 20 passes through the slit 54 between the blocking plates 51. In addition, the laser light L1 having passed through the slit 54 is emitted from the sealing window 33 toward the treatment chamber 40.

As shown in FIG. 1, the treatment chamber 40 includes a gas box 41, a blocking plate 52, a substrate stage 45, a base 46, and a scanning apparatus 47. For example, in the treatment chamber 40, a substrate M1 placed on the substrate stage 45 is irradiated with the laser light L1 and a laser annealing treatment which crystallizes an amorphous film on the substrate M1 is performed. The substrate stage 45 may be a float type stage or, in other words, a stage which conveys the substrate M1 being an irradiated object while causing the substrate M1 to float.

As shown in FIGS. 2 and 3, the gas box 41 is a box-shaped member which is hollow. The gas box 41 is arranged above the substrate stage 45 and below the sealing window 33 in the sealed portion 30. An introducing window 42 is provided on an upper surface of the gas box 41. The introducing window 42 is arranged so as to oppose the sealing window 33. In addition, an irradiating window 43 is provided on a lower surface of the gas box 41. The irradiating window 43 is arranged so as to oppose the amorphous film on the substrate M1.

A gas inlet 44 is provided on a predetermined side surface of the gas box 41. The predetermined gas 37 which is nitrogen or another inert gas is supplied to the gas box 41 from the gas inlet 44. The gas 37 supplied to the gas box 41 fills the inside of the gas box 41 and is then discharged from the irradiating window 43.

The blocking plate 52 is arranged on an optical path on which the laser light L1 emitted from the sealing window 33 of the sealed portion 30 reaches the amorphous film on the substrate M1. For example, the blocking plate 52 is arranged so as to cover the irradiating window 43 inside the gas box 41.

As shown in FIGS. 3 and 5, for example, the blocking plate 52 includes a plurality of members. For example, the blocking plate 52 includes a blocking plate 52*a* and a blocking plate 52*b*. The blocking plate 52*a* and the blocking plate 52*b* are plate-shaped members which extend in one direction. The blocking plate 52*a* and the blocking plate 52*b* are arranged with their plate surfaces facing the Z-axis direction and their direction of extension oriented in the Y-direction. The blocking plate 52*a* and the blocking plate 52*b* are arranged at intervals in the Y-axis direction. Therefore, a slit 55 is formed between the blocking plate 52*a* and the blocking plate 52*b*. Each of the blocking plates 52*a* and 52*b* is movable in the +Y-axis direction and the −Y-axis direction by a motor (not illustrated), and a width of the slit 55 (a length between the blocking plate 52*a* and the blocking plate 52*b*) can be set as appropriate. The laser light L1 passes through the slit 55. In this manner, the slit 55 through which the laser light L1 having passed through the slit 54 passes is formed in the blocking plate 52.

Both ends of the laser light L1 in the Y-axis direction are blocked by the blocking plate 52*a* and the blocking plate 52*b*. The ends of the laser light L1 blocked by the blocking plate 52*a* and the blocking plate 52*b* are reflected by the blocking plate 52*a* and the blocking plate 52*b* and become reflected light R2. In this manner, among the laser light L1 which the slit 55 and the blocking plate 52 are irradiated with, the laser light L1 blocked by the blocking plate 52 is reflected by the blocking plate 52.

The beam damper 60 is arranged so as to be capable of receiving the reflected light R2 being the laser light L1 blocked by the blocking plate 52 and then reflected by the blocking plate 52 among the laser light L1 which the slit 55 and the blocking plate 52 are irradiated with.

The reflecting mirror 57 may be provided on a surface of the blocking plate 52 on the side of the optical module 20. Accordingly, absorption by the blocking plate 52 of the laser light L1 having been blocked by the blocking plate 52 can be suppressed. Therefore, a disturbance in atmosphere in the vicinity of the blocking plate 52 due to a rise in a temperature of the blocking plate 52 can be suppressed. A reflective film included in the reflecting mirror 57 is desirably treated so as to have predetermined resistance with respect to an angle of incidence of the laser light L1.

The laser light L1 having passed through the slit 55 between the blocking plates 52 is emitted from the irradiating window 43 and the amorphous film on the substrate M1 is irradiated with the laser light L1. The laser light L1 advances in the −X direction and the −Z direction and the substrate M1 is irradiated with the laser light L1. In other words, the laser light L1 is incident to the substrate M1 from a direction inclined with respect to a normal of a main surface (XY plane) of the substrate M1.

The substrate M1 is placed on the substrate stage 45. For example, the substrate M1 is a semiconductor substrate such as a silicon substrate, a quartz substrate, or the like. Note that the substrate M1 is not limited to a semiconductor substrate and a quartz substrate. A film including a semiconductor such as an amorphous film is formed on the substrate M1. For example, the amorphous film contains amorphous silicon (aSi). The amorphous film on the substrate M1 is crystallized by being irradiating with the laser light L1. Due to the crystallization, for example, a crystalline film containing poly silicon (poly Si) is formed on the substrate M1.

The laser light L1 which the amorphous film on the substrate M1 is irradiated with is reflected by the amorphous film or the substrate M1 and becomes reflected light R3. The beam damper 60 is arranged so as to be capable of receiving the reflected light R3 being the laser light L1 which the amorphous film or the substrate M1 has been irradiated with and which is then reflected by the amorphous film or the substrate M1.

As shown in FIG. 1, the substrate stage 45 is placed on the scanning apparatus 47 via, for example, the base 46. Due to the scanning apparatus 47, the substrate stage 45 is movable in the X-axis direction, the Y-axis direction, and the Z-axis direction. When performing a laser annealing treatment, the substrate stage 45 is conveyed in, for example, a conveyance direction 49 in the −X-axis direction by scanning with the scanning apparatus 47.

Figure 6:
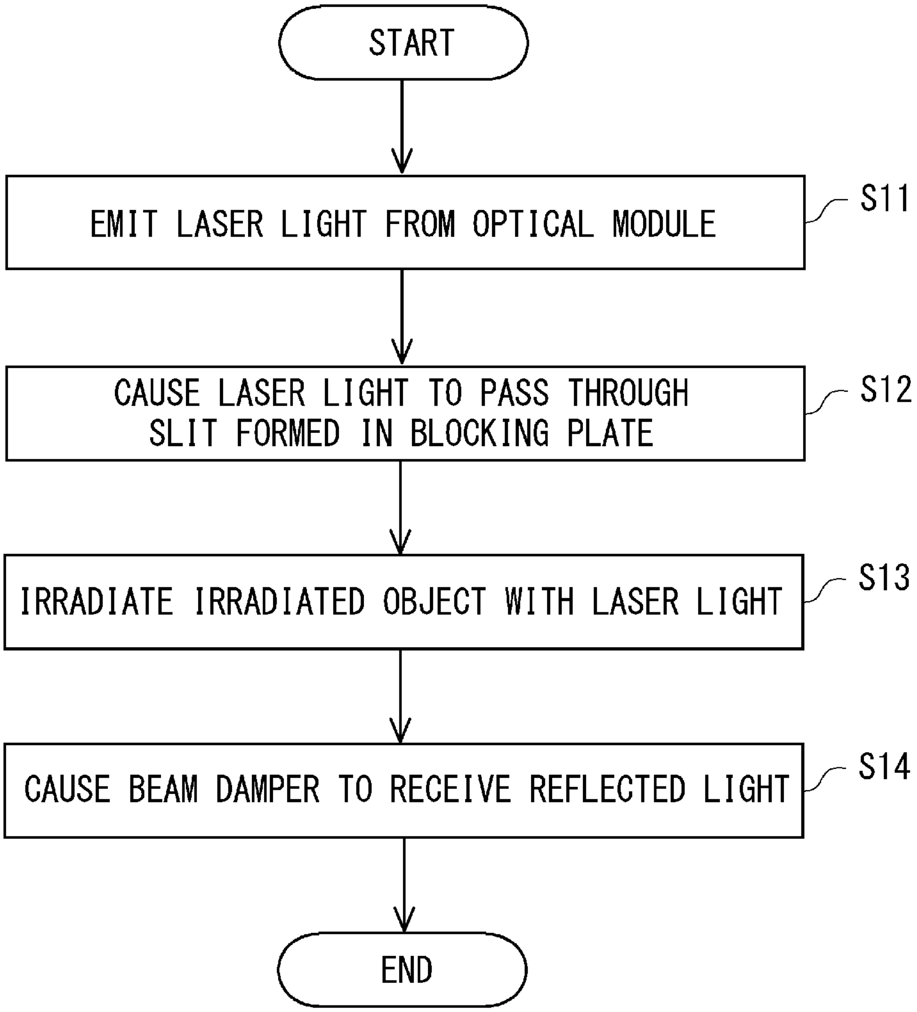
FIG. 6 is a flow chart illustrating a laser irradiation method using the laser irradiation apparatus according to the first embodiment.

Next, a laser irradiation method using the laser irradiation apparatus 1 according to the first embodiment will be described. FIG. 6 is a flow chart illustrating a laser irradiation method using the laser irradiation apparatus 1 according to the first embodiment.

As shown in step S11 in FIG. 6, first, the laser light L1 is emitted from the optical module 20. An irradiation direction, an amount of light, and the like of the laser light L1 emitted from the light source 10 are adjusted by the optical module 20 and the laser light L1 is emitted with respect to the sealed portion 30. For example, when an irradiated object is the substrate M1 on which a film including a semiconductor such as an amorphous film is formed, the laser light is emitted from the optical module toward the substrate M1.

Next, as shown in step S12 in FIG. 6, the laser light L1 is caused to pass through the slit formed in the blocking plate 51. In other words, the blocking plate 51 in which the slit 54 through which the laser light L1 passes is formed is provided, and the laser light L1 which the slit 54 has been irradiated with among the laser light L1 which the slit 54 and the blocking plate 51 have been irradiated with is caused to pass through the slit 54. In addition, the blocking plate 52 in which the slit 55 is formed is provided, and the laser light L1 which the slit 55 has been irradiated with among the laser light L1 which the slit 55 and the blocking plate 52 have been irradiated with is caused to pass through the slit 55. When the laser irradiation apparatus 1 does not include the blocking plate 51 and the blocking plate 52, step S12 can be omitted. In other words, the present embodiment can also be applied to a configuration which does not include the blocking plate 51 and the blocking plate 52.

In this case, among the laser light L1 which the slit 54 and the blocking plate 51 have been irradiated with, the laser light L1 which the blocking plate 51 has been irradiated with is blocked by the blocking plate 51. In addition, among the laser light L1 which the slit 55 and the blocking plate 52 have been irradiated with, the laser light L1 which the blocking plate 52 has been irradiated with is blocked by the blocking plate 52. Accordingly, on a cross section orthogonal to the optical axis of the laser light L1, ends are blocked and a portion other than the ends is used for irradiation of the irradiated object.

Next, as shown in step S13 in FIG. 6, the irradiated object is irradiated with the laser light L1. In other words, among the laser light L1 which the slit 54 and the blocking plate 51 are irradiated with, the irradiated object is irradiated with the laser light L1 having passed through the slit 54. When the irradiated object is a substrate on which a film including a semiconductor such as an amorphous film is formed, the amorphous film is irradiated with the laser light L1. Specifically, the amorphous film formed on the substrate M1 is irradiated with the laser light L1 while conveying the substrate M1 in the conveyance direction 49 of the substrate M1 such as the −X-axis direction.

Next, as shown in step S14 in FIG. 6, the beam damper 60 is caused to receive the reflected light R. For example, the beam damper 60 is caused to receive reflected light R3 being the laser light L1 which the substrate M1 has been irradiated with and which is then reflected by the substrate M1. The beam damper 60 is caused to receive reflected light R1 being the laser light L1 which the blocking plate 51 has been irradiated with and which is then reflected by the blocking plate 51. In addition, the beam damper 60 is caused to receive reflected light R2 being the laser light L1 which the blocking plate 52 has been irradiated with and which is then reflected by the blocking plate 52. Note that the beam damper 60 is arranged between the optical module 20 and the blocking plate 51.

In this manner, laser irradiation can be performed using the laser irradiation apparatus 1 according to the first embodiment.

Figure 7:
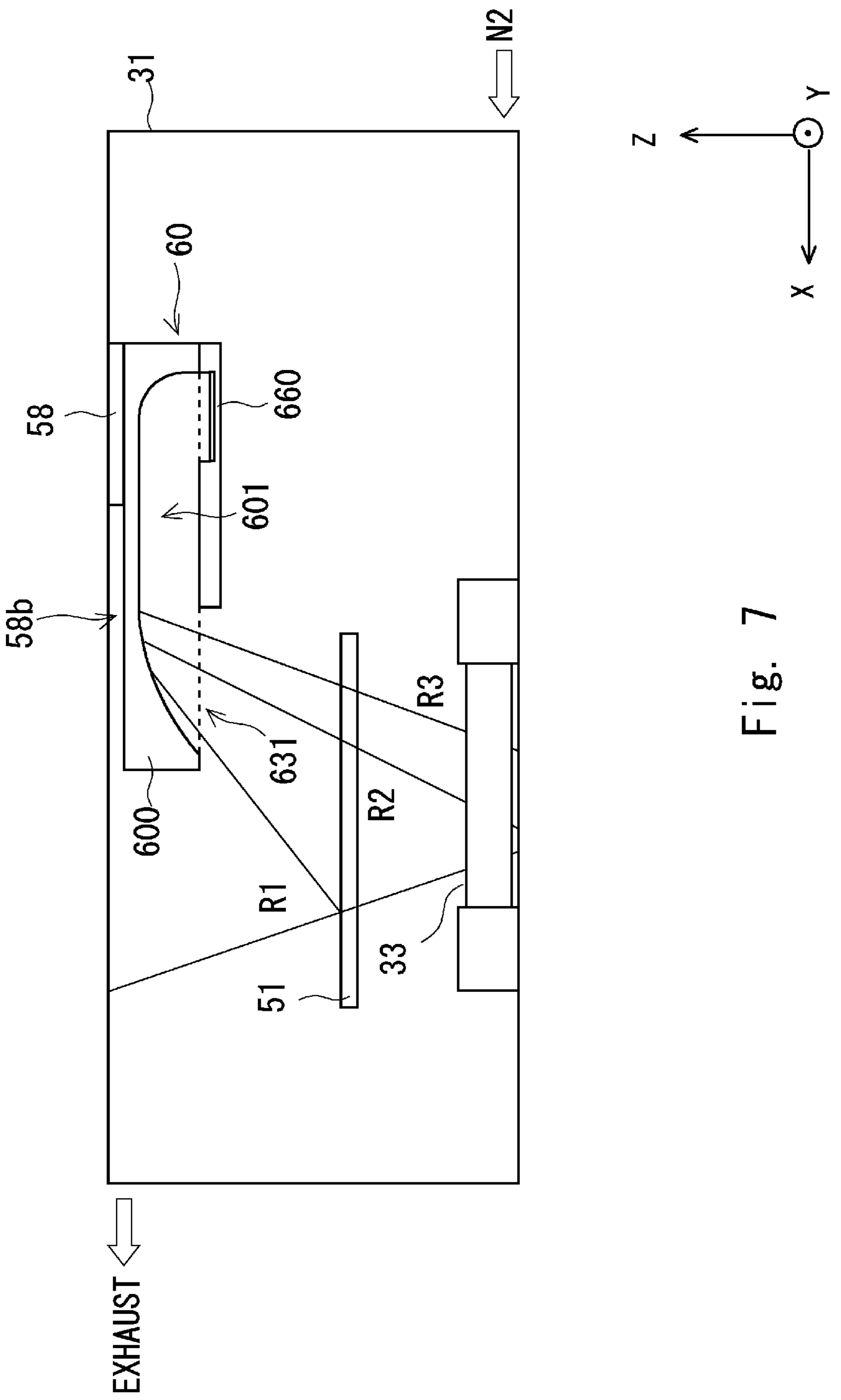
FIG. 7 is an XZ sectional view showing a configuration of a beam damper arranged in a laser irradiation apparatus.

Next, a configuration of the beam damper 60 will be described with reference to FIG. 7. FIG. 7 is a schematic view showing a sectional configuration of the sealing enclosure 31 including the beam damper 60. As described above, the beam damper 60 is arranged to receive the beams of reflected light R1 to R3 described above. The sealing enclosure 31 is supplied with nitrogen gas $N_2$ as an inert gas. Since the laser light L1 advances in the −X direction, the beams of reflected light R1 to R3 also advance in the −X direction. Therefore, the beam damper 60 is arranged further on a −X side than an irradiation position of the laser light L1 on the substrate.

The beam damper 60 is mounted to the optical module 20 via a heat insulator 58 arranged between the beam damper 60 and the optical module 20. Accordingly, heat insulating properties between the beam damper 60 and the optical module 20 can be maintained. Alternatively, a gap **58*b* to be a heat insulating air layer may be provided between the beam damper 60 and the optical module 20 and the gap 58*b* may be locally exhausted. Accordingly, heat insulating properties between the beam damper 60 and the optical module 20** can be maintained.

The beam damper 60 includes a trapping structure 600 and a light absorbing element 660 housed inside the trapping structure 600. For example, the trapping structure 600 is formed of a metal material such as aluminum or an alloy thereof. The trapping structure 600 has a structure which enables incident beams of reflected light R1 to R3 to be trapped. The trapping structure 600 is provided with a cooling tube (not illustrated in FIG. 7) for water cooling.

The light absorbing element 660 is mounted inside the trapping structure 600. The light absorbing element 660 has a multi-layer absorption film in which, for example, $SiO_2$ and Cr are alternately laminated. The light absorbing element 660 has a high absorptance with respect to a laser wavelength. For example, the light absorbing element 660 has an absorptance of 95% or more or, more preferably, 98% or more with respect to a laser wavelength. While 308 nm has been described as the laser wavelength, the laser wavelength is not limited thereto. For example, the laser wavelength is in an ultraviolet range such as 248 nm, 351 nm, or 355 nm. It is needless to say that the light absorbing element 660 is not limited to a multi-layer film structure.

The beams of reflected light R1 to R3 incident to the trapping structure 600 are repetitively reflected inside the trapping structure 600 before being incident to the light absorbing element 660. The trapping structure 600 is capable of trapping the incident beams of reflected light R1 to R3. The trapping structure 600 has a shape which prevents the beams of reflected light R1 to R3 incident to an internal space 601 from leaking outside.

Specifically, the trapping structure 600 has an opening portion 631 to which the beams of reflected light R1 to R3 are incident on an end on the +X side. The light absorbing element 660 is provided on an end on the −X side of the internal space 601. The beams of reflected light R1 to R3 incident to the internal space 601 from the opening portion 631 propagate inside the internal space 601 in the −X direction. In the internal space 601, the beams of reflected light R1 to R3 having been reflected once or a plurality of times by an inner wall of the trapping structure 600 are incident to the light absorbing element 660. The light absorbing element 660 absorbs a part of the beams of reflected light R1 to R3.

Furthermore, the inner wall of the trapping structure 600 is configured as a reflection surface with an optical reflectance of around 90% with respect to a laser wavelength. An inner wall which constitutes the internal space 601 of the trapping structure 600 absorbs a part of reflected light. In other words, every time the beams of reflected light R1 to R3 are reflected by the trapping structure 600, a part of the beams of reflected light R1 to R3 are absorbed. Accordingly, since energy incident to the light absorbing element 660 can be suppressed, degradation of the light absorbing element 660 can be prevented.

In this manner, the trapping structure 600 absorbs a part of reflected light incident to the internal space 601. The trapping structure 600 is constituted of a metal material with high thermal conductivity and is water-cooled. Therefore, laser energy can be efficiently absorbed and a temperature rise can be suppressed.

Figure 8:
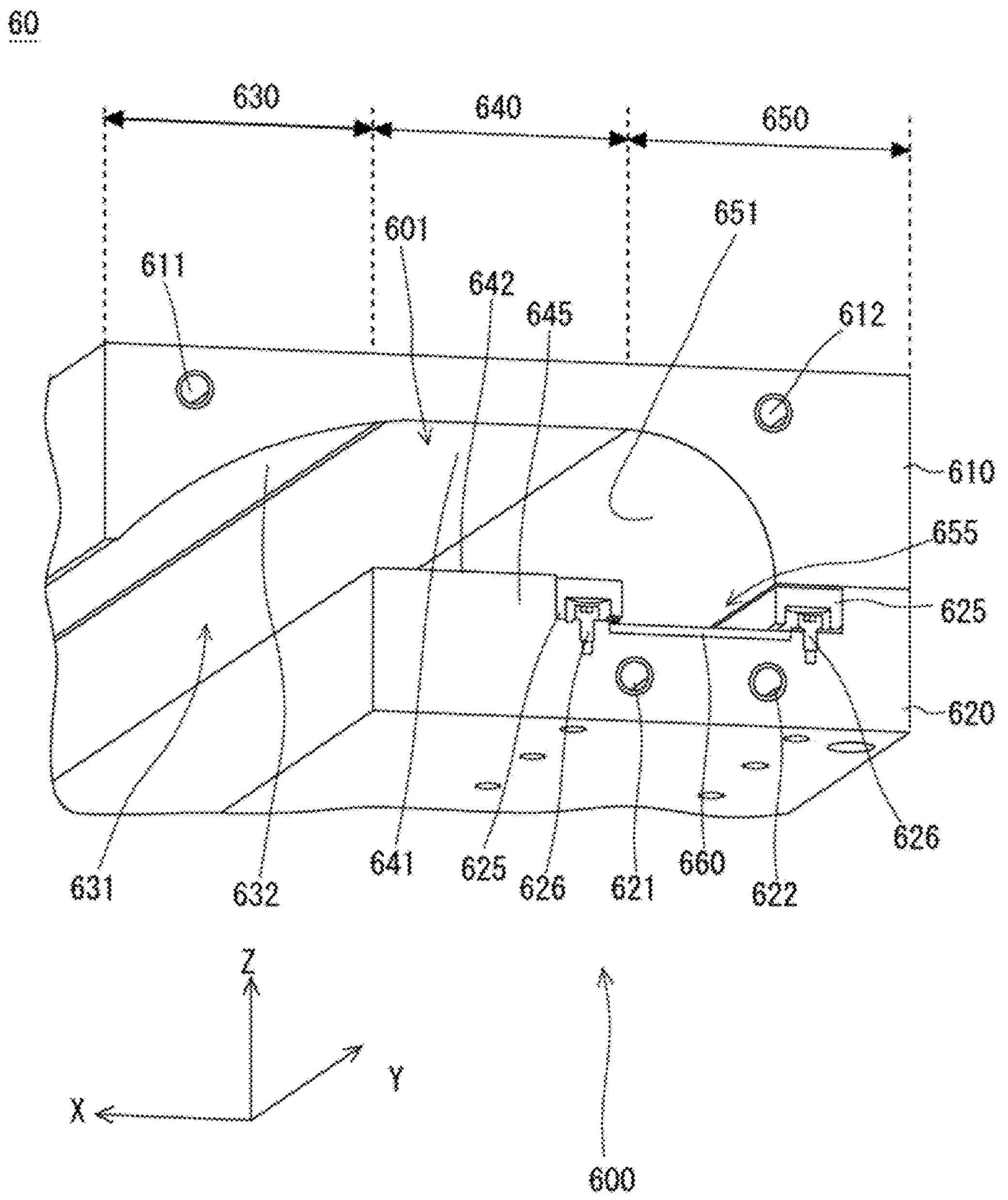
FIG. 8 is a perspective view showing a configuration of the beam damper.

An example of a configuration of the beam damper 60 will be described with reference to FIG. 8. FIG. 8 is a perspective view showing a detailed configuration of the beam damper 60. FIG. 8 is a sectional view of the beam damper 60 from obliquely downward.

The trapping structure 600 has a member 610 and a member 620. The member 620 is arranged below the member 610. The member 620 is fixed so as to oppose the member 610. For example, the member 620 can be mounted to the member 610 by inserting a bolt (not illustrated) through the member 620 from below. Alternatively, the member 610 and the member 620 may be fixed to each other by inserting a bolt through the member 610 from above. It is needless to say that a method of fixing the member 610 and the member 620 to each other is not particularly limited and the member 610 and the member 620 may be fixed to each other using a bracket or the like.

The internal space 601 is formed between the member 610 and the member 620. The member 610 defines an upper end (an end on the +Z side) of the internal space 601 and the member 620 defines a lower end (an end on the −Z side) of the internal space 601. The beams of reflected light R1 to R3 propagate through the internal space 601 between the member 610 and the member 620.

The member 610 and the member 620 are formed of a metal material such as aluminum. The member 610 is provided with a cooling tube 611 and a cooling tube 612. By providing the member 610 with a through hole along the Y direction, the cooling tube 611 and the cooling tube 612 can be inserted into the member 610. The cooling tube 611 and the cooling tube 612 are arranged along the Y direction. It is needless to say that the cooling tube 611 and the cooling tube 612 may be fixed to the member 610 with a water-cooling jacket or the like.

In a similar manner, the member 620 is provided with a cooling tube 621 and a cooling tube 622. By providing the member 620 with a through hole along the Y direction, the cooling tube 621 and the cooling tube 622 can be inserted into the member 620. The cooling tubes 621 and 622 are arranged directly beneath the light absorbing element 660. The cooling tube 621 and the cooling tube 622 are arranged along the Y direction. The cooling tube 621 and the cooling tube 622 may be fixed to the member 620 with a water-cooling jacket or the like.

In this manner, by running cooling water through the cooling tube 611, the cooling tube 612, the cooling tube 621, and the cooling tube 622, the trapping structure 600 can be effectively cooled. It is needless to say that the arrangement and the number of the cooling tube 611, the cooling tube 612, the cooling tube 621, and the cooling tube 622 are not limited to the configuration shown in FIG. 7. Arranging the cooling tube 621 and the cooling tube 622 in the vicinity of the light absorbing element 660 enables cooling to be performed in an efficient manner.

The trapping structure 600 has an eaves portion 630, an opposing portion 640, and a terminal portion 650. The eaves portion 630, the opposing portion 640, and the terminal portion 650 are arranged in this order from a +X side. In other words, the eaves portion 630 is arranged on a most +X side and the terminal portion 650 is arranged on a most −X side. The most +X-side portion of the trapping structure 600 is the eaves portion 630, and the most −X-side portion of the trapping structure 600 is the terminal portion 650. In the X direction, the opposing portion 640 is arranged between the eaves portion 630 and the terminal portion 650.

The member 610 is arranged so as to protrude more to the +X side than the member 620 and the protruding portion becomes the eaves portion 630. The beams of reflected light R1 to R3 are incident to the eaves portion 630. Since the member 620 is not arranged in the eaves portion 630, the opening portion 631 is formed below the eaves portion 630. In addition, in the eaves portion 630, a lower surface of the member 610 constitutes a reflection surface 632. The beams of reflected light R1 to R3 are incident to the reflection surface 632 via the opening portion 631. The reflection surface 632 is configured as a concave surface which is arranged so as to face the −X side and the −Z side. For example, the reflection surface 632 functions as a cylindrical mirror with the Y direction as an axial direction. Reflected light having been reflected by the reflection surface 632 advances in the −X direction and the −Z direction and propagates through the internal space 601. In other words, a reflection surface 632 reflects reflected light toward the opposing portion 640 or the terminal portion 650.

The opposing portion 640 includes an upper reflection surface 641 and a lower reflection surface 642. The upper reflection surface 641 is a lower surface of the member 610. The lower reflection surface 642 is an upper surface of the member 620. In the opposing portion 640, the member 620 has a projecting portion 645 which projects toward the +Z side. A top surface of the projecting portion 645 constitutes the lower reflection surface 642. The upper reflection surface 641 and the lower reflection surface 642 are arranged so as to oppose each other. The upper reflection surface 641 and the lower reflection surface 642 are arranged separated from each other in the Z direction. A space between the upper reflection surface 641 and the lower reflection surface 642 forms a part of the internal space 601.

The upper reflection surface 641 and the lower reflection surface 642 are flat surfaces. For example, the upper reflection surface 641 and the lower reflection surface 642 are parallel to the XY plane. The upper reflection surface 641 and the lower reflection surface 642 function as plane mirrors. The upper reflection surface 641 reflects reflected light in the −X direction and the −Z direction. The lower reflection surface 642 reflects reflected light in the −X direction and the +Z direction. Therefore, the reflected light reflected by the upper reflection surface 641 or the lower reflection surface 642 advances toward the terminal portion 650. While the upper reflection surface 641 and the lower reflection surface 642 are flat surfaces which are parallel to each other, alternatively, the upper reflection surface 641 and the lower reflection surface 642 may be flat surfaces which are not parallel to each other. For example, the upper reflection surface 641 and the lower reflection surface 642 may be tapered surfaces of which spacing between the upper reflection surface 641 and the lower reflection surface 642 widens when advancing in the −X direction.

The light absorbing element 660 is provided in the terminal portion 650. The light absorbing element 660 is fixed to the member 620. In the terminal portion 650, the light absorbing element 660 is arranged facing upward on the upper surface of the member 620. A recessed portion 655 is provided on the −X side of the projecting portion 645, and the light absorbing element 660 is arranged in the recessed portion 655. For example, the light absorbing element 660 is a plate-shaped member with an XY plane as a main surface. In an XY plan view, the light absorbing element 660 has a rectangular shape with the Y direction as a longitudinal direction and the X direction as a short-side direction.

A reflection surface 651 is arranged above the light absorbing element 660. A space between the reflection surface 651 and the light absorbing element 660 forms a part of the internal space 601. The reflection surface 651 is configured as a concave surface which is arranged so as to face the +X side and the −Z side. For example, the reflection surface 651 functions as a cylindrical mirror with the Y direction as an axial direction in the internal space 601. Reflected light having been reflected by the reflection surface 651 advances in the +X direction and the −Z direction and is incident to the light absorbing element 660. The light absorbing element 660 absorbs the incident reflected light. The reflection surface 651 defines an upper end (an end on the +Z side) of the internal space 601 in the terminal portion 650. The reflection surface 651 defines an end on the −X side of the internal space 601.

In this manner, with the exception of the opening portion 631, the internal space 601 of the trapping structure 600 is enclosed by the reflection surface 632, the upper reflection surface 641, the lower reflection surface 642, and the reflection surface 651. The reflected light R3 from the substrate M is incident to the internal space 601 of the trapping structure 600 via the opening portion 631. The reflected light incident via the opening portion 631 is incident to the reflection surface 632, the upper reflection surface 641, the lower reflection surface 642, the reflection surface 651, and the like. In addition, the reflectance of the reflection surface 632, the upper reflection surface 641, the lower reflection surface 642, and the reflection surface 651 is around 90%. Therefore, every time the reflected light is reflected by the reflection surface 632, the upper reflection surface 641, the lower reflection surface 642, and the reflection surface 651, a part of the reflected light is absorbed by the member 610 or the member 620.

The light absorbing element 660 is arranged in the recessed portion 655 of the terminal portion 650. A fixture 626 is provided at both ends of the light absorbing element 660. The fixture 626 is, for example, a bolt which fixes the light absorbing element 660 to the member 620. In addition, a top portion of the fixture 626 is covered by a cover 625. The cover 625 is formed of a metal material in a similar manner to the member 610 and the member 620.

Figure 9:
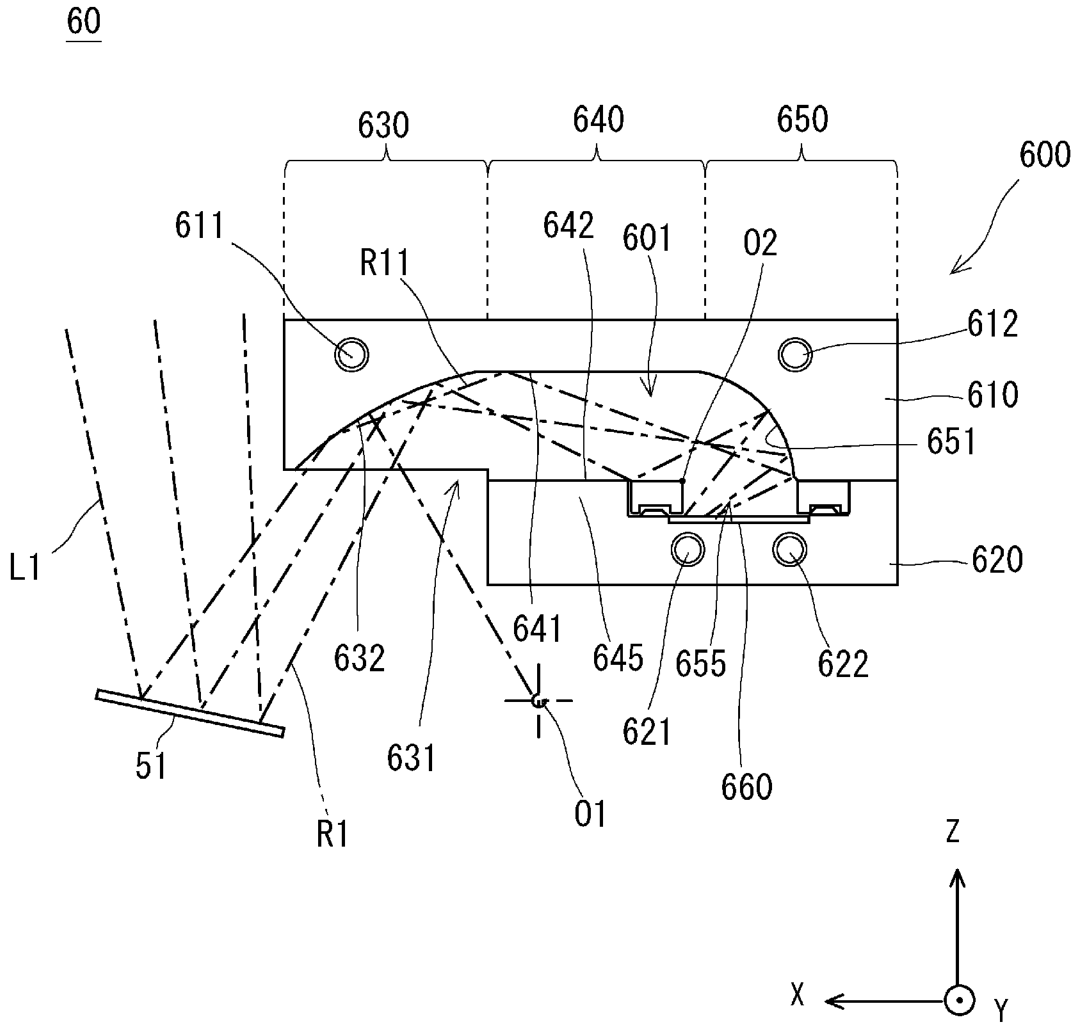
FIG. 9 is an XZ sectional view showing an optical path of reflected light in an internal space of the beam damper.
Figure 10:
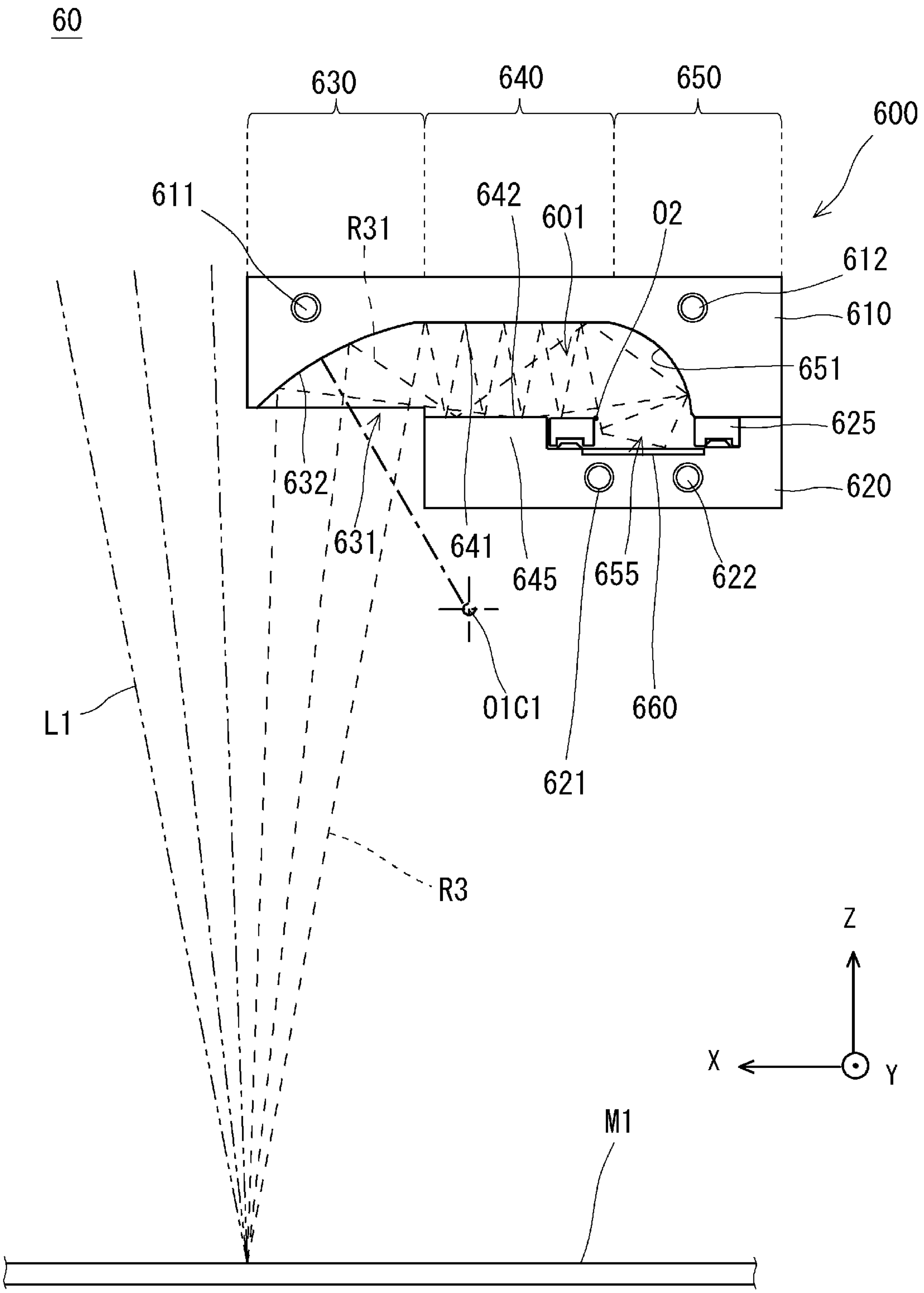
FIG. 10 is an XZ sectional view showing an optical path of reflected light in the internal space of the beam damper.

FIG. 9 is a schematic view showing an optical path of the reflected light R1 having been reflected by the blocking plate 51. FIG. 10 is a schematic view showing an optical path of the reflected light R3 having been reflected by the substrate M. FIG. 9 and FIG. 10 respectively show optical paths of the reflected light R1 and the reflected light R3 on the XZ cross section.

As shown in FIG. 9, the reflected light R1 is incident to the reflection surface 632 via the opening portion 631. Reflected light R11 having been reflected by the reflection surface 632 is guided to the internal space 601 of the trapping structure 600. A part of the reflected light R11 from the reflection surface 632 is reflected by the lower reflection surface 642 and the reflection surface 651 in this order. A part of the reflected light R11 from the reflection surface 632 is directly incident to the reflection surface 651. A part of the reflected light R11 from the reflection surface 632 is reflected by the upper reflection surface 641 and the reflection surface 651 in this order. The reflection surface 651 reflects the reflected light R11 toward the light absorbing element 660. The light absorbing element 660 absorbs the incident reflected light R1. In addition, in FIG. 9, in order to cause the beam damper 60 to receive the reflected light R1, the blocking plate 51 is arranged inclined with respect to the XY plane. Alternatively, the beam damper 60 may be caused to receive the reflected light R1 by partially bending the blocking plate 51.

In a similar manner, as shown in FIG. 10, the reflected light R3 from the substrate M is incident to the reflection surface 632 via the opening portion 631. Reflected light R31 having been reflected by the reflection surface 632 is guided to the internal space 601 of the trapping structure 600. The reflected light R31 having been reflected by the reflection surface 632 is incident to the lower reflection surface 642. A part of the reflected light R31 having been reflected by the lower reflection surface 642 is reflected by the lower reflection surface 642 and is incident to the reflection surface 651. A part of the reflected light R31 having been reflected by the lower reflection surface 642 is repetitively reflected by the lower reflection surface 642 and the upper reflection surface 641 and is incident to the reflection surface 651. The reflected light R31 having been reflected by the reflection surface 651 is incident to the light absorbing element 660 either directly or by being reflected by the cover 625. The light absorbing element 660 absorbs the incident reflected light R31. Since the reflected light R3 advances in a direction closer to the Z direction than the reflected light R1, the number of reflections in the internal space 601 increases.

In this manner, the trapping structure 600 is capable of trapping beams of reflected light incident to the reflection surface 632 at various angles. In other words, almost all of the beams of reflected light incident to the reflection surface 632 are guided to the light absorbing element 660 without leaking outside of the trapping structure 600 from the opening portion 631. Therefore, reflected light can be efficiently absorbed and a displacement of optical elements due to a temperature rise can be suppressed. In addition, although not illustrated, reflected light R2 having been reflected by the blocking plate 52 is also trapped inside the trapping structure 600 and absorbed by the light absorbing element 660.

For example, in an XZ plan view, the reflection surface 632 may be made a curved mirror with a center of curvature O1. In other words, in the XZ plan view, the reflection surface 632 is formed in an arc shape centered on the center of curvature O1. The center of curvature O1 is arranged outside the internal space 601. Specifically, the center of curvature O1 is arranged below (on the −Z side) of the opposing portion 640. It is needless to say that the shape of the reflection surface 632 in the XZ plan view is not limited to an arc shape of a true circle and may be a curved surface with an arc shape of an ellipse, a parabolic shape, or the like. In addition, the reflection surface 632 may be an inclined flat surface facing the −Z direction and the −X direction.

In the XZ plan view, the reflection surface 651 is preferably made a curved surface. In the XZ plan view, the reflection surface 651 is a 90-degree arc. A center of curvature O2 of the reflection surface 651 is inside the internal space 601. Note that the shape of the reflection surface 651 is not limited to an arc of a true circle and may be a curved surface such as an arc of an ellipse, a parabolic shape, or the like. In addition, the reflection surface 651 may be an inclined flat surface facing the −Z direction and the +X direction.

In the opposing portion 640, the member 620 is provided with the projecting portion 645 which projects toward the +Z side. In the terminal portion 650, the member 620 is provided with the recessed portion 655 which is depressed toward the −Z side. The lower reflection surface 642 is arranged further toward the +Z side than the light absorbing element 660. Accordingly, reflected light can be trapped in the internal space 601 in an efficient manner. In other words, reflected light having been reflected by the light absorbing element 660 and the reflection surface 651 and advancing in the −Z direction and the +X direction can be prevented from leaking out from the trapping structure 600. Accordingly, since reflected light can be efficiently absorbed, a displacement of an optical system due to a temperature rise can be suppressed.

According to the configuration of the present embodiment, a temperature rise of the optical module can be suppressed. For example, reflection and scattering occur in no small measure on a surface of the light absorbing element 660. In the case of a high-output laser, effects of the reflected light and the scattered light increase, and there is a possibility that a member (for example, the blocking plate 51) inside the sealing enclosure absorbs the light and causes a temperature rise. According to the configuration of the present embodiment, an effect of a temperature rise on the optical elements inside the sealing enclosure 31 can be suppressed. The sealing enclosure 31 houses the blocking plate 51 and the beam damper 60. Therefore, the effect on the blocking plate 51 can be suppressed.

According to the configuration of the present embodiment, a temperature rise of the optical module due to irradiation of the beams of reflected light R1 to R3 can be suppressed and a deformation of the enclosure of the optical module is suppressed. Accordingly, a positional displacement of each optical element provided in the optical module can be suppressed and uneven irradiation of laser light can be suppressed. The substrate M can be irradiated with laser light in a stable manner.

In addition, when a density distribution of a gas inside the sealing enclosure 31 becomes uneven due to a temperature rise of the trapping structure 600 or the light absorbing element 660, an optical path length of the laser light may be affected and an irradiation result may be adversely affected. In the present embodiment, since the effect on the sealing enclosure 31 can be suppressed, a laser irradiation process can be carried out in a stable manner.

Even when using high-output laser light, deterioration of the light absorbing element 660 can be suppressed. In the present embodiment, since reflected light is prevented from being directly incident to the light absorbing element 660, a temperature rise of the light absorbing element 660 can be suppressed. In other words, a part of reflected light is absorbed by the trapping structure 600 which is being cooled by water. Accordingly, since degradation of the light absorbing element 660 can be suppressed, a life span of the light absorbing element 660 can be extended. As a result, productivity can be improved.

Furthermore, since an increase in size of the beam damper 60 can be prevented, the present embodiment is also applicable to the laser irradiation apparatus 1 which is subject to limited installation space.

Hereinafter, measurement results of a temperature rise in the configuration of the present embodiment and a configuration of a comparative example will be described. A configuration which does not adopt the trapping structure 600 according to the present embodiment will be used as the comparative example. In other words, the comparative example is configured such that reflected light from the substrate M and the blocking plate 51 is directly incident to the light absorbing element 660 as in Patent Literature 1.

A measurement result when a beam length in the Y direction is set to 500 mm and a beam output is set to 360 W will now be described. A flow rate of cooling water is set to 1.2 l/min. A temperature rise of the light absorbing element is 50.8° C. in the comparative example and 7.9° C. in the present embodiment. According to the configuration of the present embodiment, a temperature rise of the light absorbing element 660 can be suppressed.

A temperature rise of the cooling water is 2.6° C. in the comparative example and 3.8° C. in the present embodiment. The temperature rise of the cooling water when all of the light energy of the laser light is used to raise the temperature of the cooling water is 4.3° C. According to the configuration of the present embodiment, cooling efficiency by the cooling water can be increased. Therefore, deterioration of the light absorbing element 660 due to a temperature rise can be suppressed.

A ratio of scattered light/leaked light to incident light to the beam damper 60 is 40% in the comparative example and 12% in the present embodiment. A temperature of components of the optical module 20 as estimated from the scattered light is 40° C. in the comparative example and 28° C. in the present embodiment. In this manner, a temperature rise of optical components can be suppressed. Furthermore, when the laser light output is set to 0.64 kW, discoloration of the light absorbing element 660 was observed in the configuration of the comparative example after continuous use for 10 minutes but no discoloration was observed in the present embodiment even after continuous use for four hours.

An example of a size of the trapping structure 600 will be described. First, dimensions in the Z direction will be described. The size (length) of the trapping structure 600 in the Z direction is 78 mm. In other words, a distance from the upper surface (upper end) of the member 610 to the lower surface (lower end) of the member 620 is 78 mm. The size (length) of the member 610 in the Z direction is 50 mm. In other words, a distance from the lower reflection surface 642 to the upper end of the member 610 in the Z direction is 50 mm.

The size (length) of the member 620 in the Z direction is 28 mm. In other words, a distance from the lower reflection surface 642 to the lower surface of the member 620 in the Z direction is 28 mm. In the Z direction, a distance from the upper reflection surface 641 to the upper surface of the member 610 is 17 mm. Spacing between the upper reflection surface 641 and the lower reflection surface 642 in the Z direction is, for example, 33 mm. In the Z direction, a height of the projecting portion 645 or, in other words, a depth of the recessed portion 655 is 8 mm.

Next, dimensions in the X direction will be described. The size of the trapping structure 600 in the X direction is 180 mm. In the X direction, the size of the eaves portion 630 is 60 mm. In the X direction, a total size of the opposing portion 640 and the terminal portion 650 is 120 mm.

Next, the reflection surface 651 and the reflection surface 632 to be curved surfaces will be described. In the XY plan view, the reflection surface 651 is an arc with a radius of curvature of 33 mm. The reflection surface 651 is a 90° fan-like arc. In the XY plan view, the reflection surface 632 can be made an arc with a radius of curvature of 100 mm. It is needless to say that the trapping structure 600 is not limited to the sizes described above. The trapping structure 600 may be appropriately designed in accordance with a spread angle of the laser light L1 or distances to the substrate M or the blocking plate 51.

Figure 11:
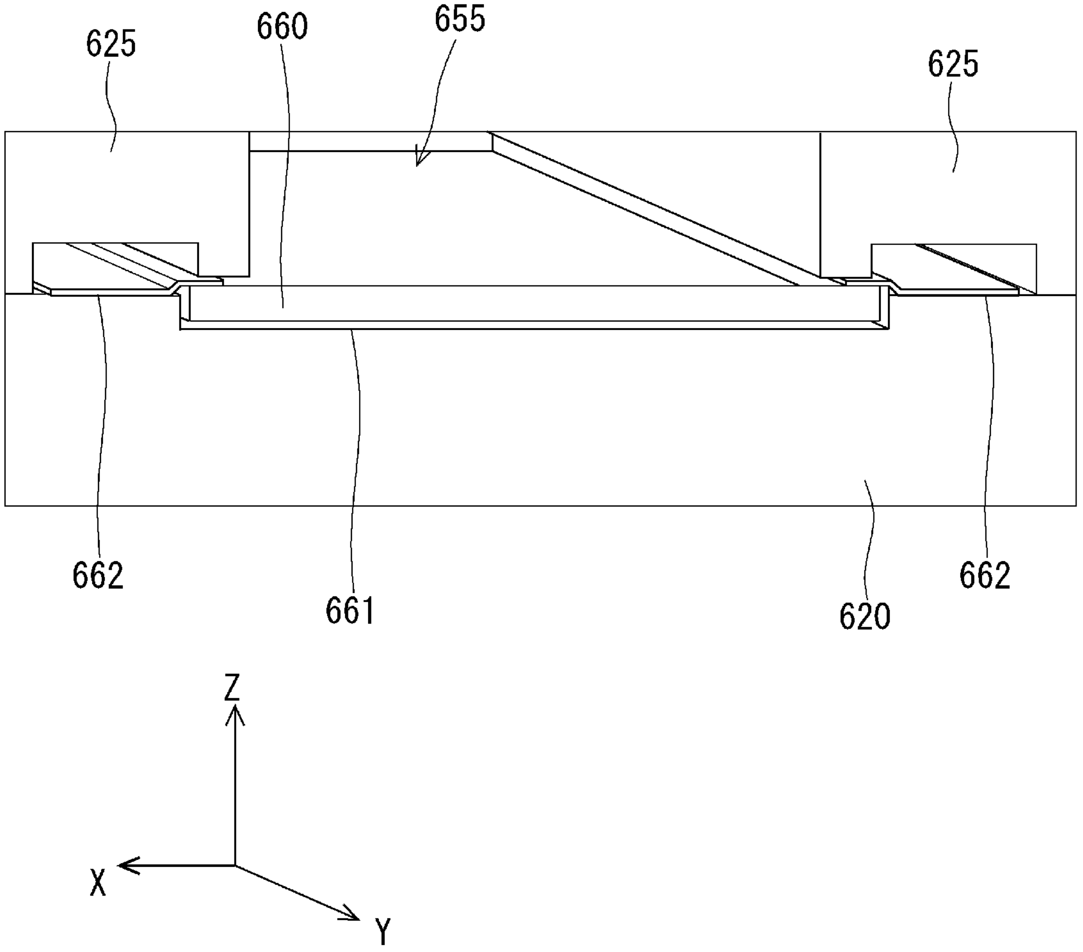
FIG. 11 is a perspective view showing an example of a mounting structure of a light absorbing element.

Next, an example of a mounting structure for mounting the light absorbing element 660 to the trapping structure 600 will be described with reference to FIG. 11. FIG. 11 is a perspective view schematically showing the mounting structure of the light absorbing element 660. FIG. 11 shows a sectional configuration of the trapping structure 600 in a periphery of a bottom portion of the recessed portion 655.

The light absorbing element 660 is arranged in the recessed portion 655 provided in the member 620 as described above. A sheet 661 is arranged between the member 620 and the light absorbing element 660. The sheet 661 is, for example, a graphite sheet with a thickness of 0.5 mm. By interposing the sheet 661 between the member 620 and the light absorbing element 660, heat of the light absorbing element 660 can be efficiently transferred to the member 620. Accordingly, a temperature rise of the light absorbing element 660 can be suppressed.

Furthermore, a leaf spring 662 is provided at both sides of the light absorbing element 660 in the X direction. The leaf spring 662 is fixed to the member 620 by the fixture 626 (refer to FIG. 8) such as a bolt. The leaf spring 662 extends to above an end of the light absorbing element 660 in the X direction. In other words, the leaf spring 662 mounted to the member 620 protrudes to above the light absorbing element 660. The light absorbing element 660 is fixed to the member 620 via the leaf spring 662.

The leaf spring 662 generates a biasing force which biases the light absorbing element 660 in the −Z direction. The leaf spring 662 presses the light absorbing element 660 against the sheet 661. Accordingly, heat of the light absorbing element 660 can be efficiently dissipated. It is needless to say that the light absorbing element 660 may be biased in the −Z direction by an elastic body other than the leaf spring 662.

Furthermore, the cover 625 is provided at both ends of the light absorbing element 660 in the X direction. The cover 625 is arranged so as to cover the leaf spring 662. For example, the cover 625 is fixed to the member 620. By providing the cover 625, reflected light and scattered light on the surface of the light absorbing element 660 can be prevented from leaking out from the trapping structure 600. The cover 625 is formed of a metal material such as an aluminum alloy in a similar manner to the member 610 and the member 620. The cover 625 may be subjected to surface treatment in order to increase absorptance with respect to a laser wavelength. According to such a configuration, leakage of reflected light can be suppressed and, at the same time, heat can be dissipated in an efficient manner.

The laser irradiation apparatus 1 according to the present embodiment includes the beam damper 60. The beam damper 60 is arranged so as to receive reflected light R1 having been reflected by the blocking plate 51, reflected light R2 having been reflected by the blocking plate 52, and reflected light R3 having been reflected by the substrate M. The beams of reflected light R1 to R3 can be prevented from reaching the optical module 20. A temperature rise of the optical module due to irradiation of the beams of reflected light R1 to R3 can be suppressed and a deformation of the enclosure of the optical module is suppressed. Accordingly, a positional displacement of each optical element provided in the optical module can be suppressed and uneven irradiation of laser light can be suppressed.

In addition, the beams of reflected light R1 to R3 are allowed to reach the beam damper 60. Therefore, a cause of a temperature gradient with respect to the optical module 20 can be limited to, for example, only the beam damper 60 and a countermeasure for suppressing a temperature rise of the optical module 20 can be simplified.

The beam damper 60 is not directly mounted to the optical module 20 and is arranged so that a space is formed between the beam damper 60 and the optical module 20. Accordingly, heat insulating properties between the beam damper 60 and the optical module 20 can be improved. In addition, the beam damper 60 is mounted to the optical module 20 via a heat insulator between the beam damper and the optical module 20. This also contributes toward improving the heat insulating properties between the beam damper 60 and the optical module 20.

The beam damper 60 is arranged above the sealing window 33 provided above the gas box 41. Therefore, even if receiving the beams of reflected light R1 to R3 causes a temperature in a vicinity of the beam damper 60 to rise, since the gas box 41 is arranged between the beam damper 60 and the substrate M1, a disturbance in the atmosphere in a vicinity of the substrate M1 can be suppressed. As a result, uneven irradiation due to a disturbance in the atmosphere can be suppressed.

Providing the reflecting mirror 57 on the surfaces of the blocking plates 51 and 52 on the side of the optical module 20 enables absorption of the laser light L1 by the blocking plates 51 and 52 to be suppressed. Accordingly, a disturbance in atmosphere in the vicinity of the blocking plates 51 and 52 due to a rise in a temperature of the blocking plates 51 and 52 can be suppressed. As a result, uneven irradiation due to a disturbance in the atmosphere can be suppressed. Providing the reflecting mirror 57 on at least the blocking plate 51 which is close to the optical module 20 enables uneven irradiation due to a disturbance in atmosphere to be suppressed.

A flow rate of the gas 37 is controlled so as to constantly keep the inside of the sealing enclosure 31 in a ventilated state. Accordingly, a temperature rise in the atmosphere inside the sealing enclosure 31 can be suppressed. Therefore, a change in fluid density and a fluctuation in a refractive index due to a temperature gradient of the atmosphere through which the laser light L1 passes can be suppressed and uneven irradiation can be suppressed.

First Modified Example

Figure 12:
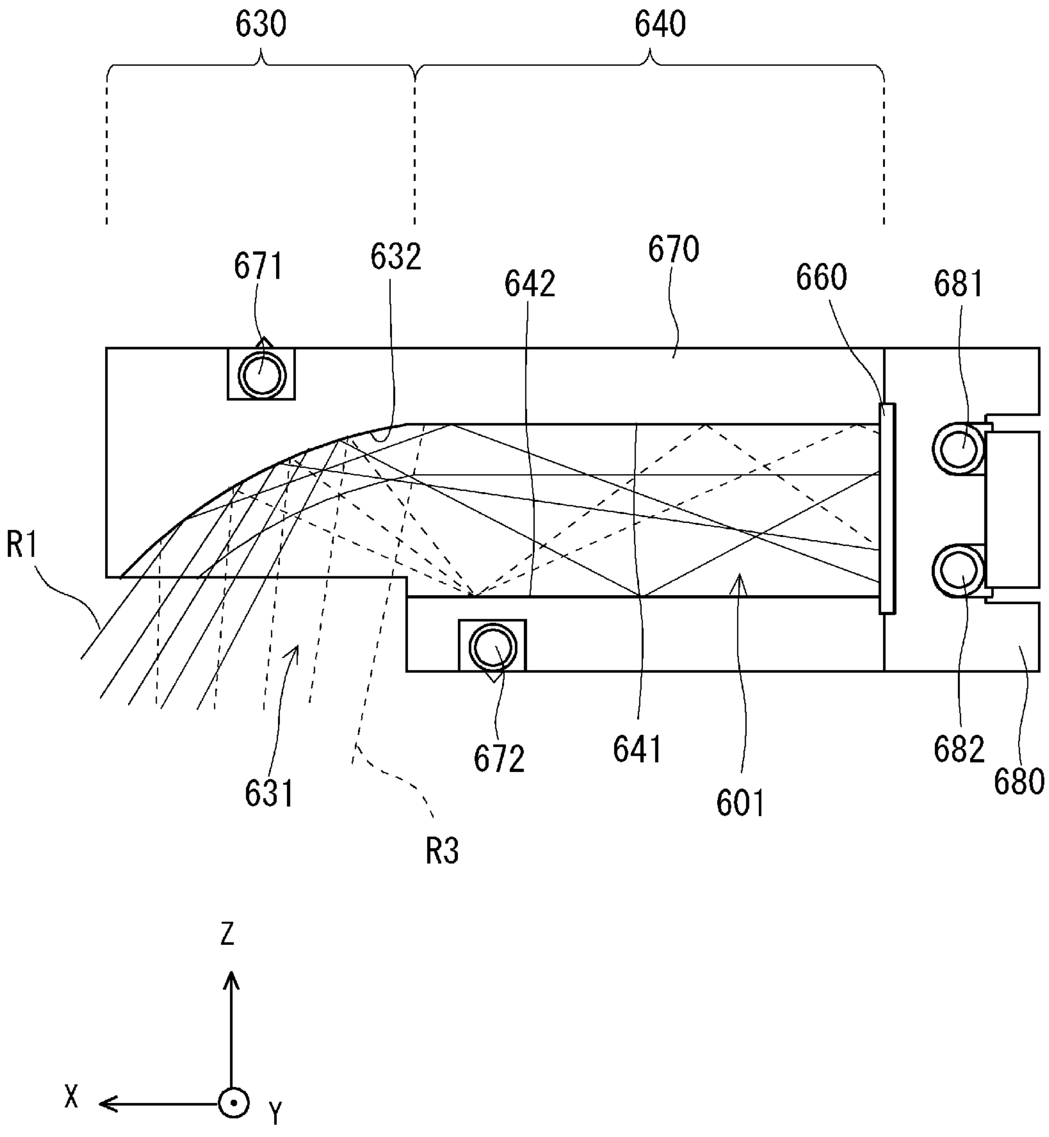
FIG. 12 is an XZ sectional view showing a configuration of the beam damper according to a modified example.

While the member 610 and the member 620 are arranged side by side in the Z direction in the first embodiment, in the first modified example, two members are arranged side by side in the X direction. The beam damper 60 according to the first modified example will now be described with reference to FIG. 12. A member 680 is mounted to a −X side of a member 670. The member 670 defines an upper end and a lower end of the internal space 601. The member 680 defines an end on a −X side of the internal space 601.

The trapping structure 600 includes the eaves portion 630 and the opposing portion 640. In other words, in the first modified example, the terminal portion 650 is not provided in the trapping structure 600. The eaves portion 630 and the opposing portion 640 is provided in the member 670. In a similar manner to the first embodiment, the eaves portion 630 has the opening portion 631 and the reflection surface 632. In a similar manner to the first embodiment, the opposing portion 640 includes the upper reflection surface 641 and the lower reflection surface 642.

In the first modified example, the terminal portion 650 is not provided. The light absorbing element 660 is arranged on the −X side of the opposing portion 640. Therefore, in the first modified example, the recessed portion 655 and the projecting portion 645 are not provided. The light absorbing element 660 is arranged facing the +X side. Therefore, reflected light advancing toward the −X side is absorbed by the light absorbing element 660.

The member 680 is provided with cooling tubes 681 and 682. The cooling tube 681 and the cooling tube 682 are arranged on the −X side of the light absorbing element 660. The member 670 is provided with cooling tubes 671 and 672. Even with such a configuration, since the beams of reflected light R1 to R3 can be trapped inside the trapping structure 600, a temperature rise can be suppressed.

(Organic EL display)

A semiconductor apparatus including the polysilicon film described above is suitable for a TFT (thin film transistor) array substrate for an organic EL (Electro Luminescence) display. In other words, a polysilicon film is used as a semiconductor layer including a source region, a channel region, and a drain region of a TFT.

Figure 13:
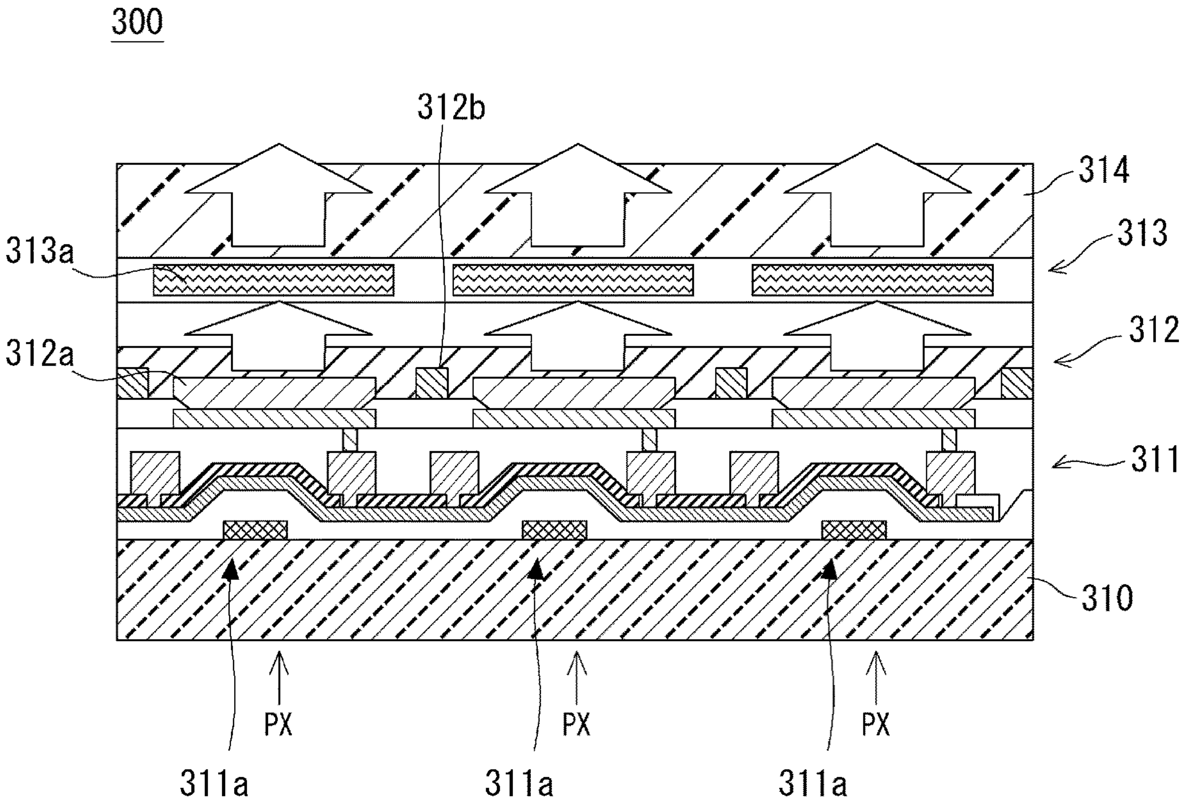
FIG. 13 is a sectional view showing a simplified configuration of an organic EL display.

Hereinafter, a configuration in which the semiconductor apparatus according to the present embodiment is applied to an organic EL display display will be described. FIG. 13 is a simplified sectional view of an element circuit of an organic EL display. An organic EL display 300 shown in FIG. 13 is an active matrix-type display apparatus in which a TFT is arranged in each pixel PX.

The organic EL display 300 includes a substrate 310, a TFT layer 311, an organic layer 312, a color filter layer 313, and a sealing substrate 314. FIG. 13 shows an organic EL display adopting a top emission system in which a side of the sealing substrate 314 is a viewing side. Note that the following description presents a configuration example of an organic EL display and that the present embodiment is not limited to the configuration described below. For example, the semiconductor apparatus according to the present embodiment may be used in an organic EL display adopting a bottom emission system.

The substrate 310 is a glass substrate or a metal substrate. The TFT layer 311 is provided on top of the substrate 310. The TFT layer 311 has a TFT 311*a* arranged in each pixel PX. In addition, the TFT layer 311 has a wiring (not illustrated) connected to the TFT 311*a* and the like. The TFT 311*a*, the wiring, and the like constitute a pixel circuit.

The organic layer 312 is provided on top of the TFT layer 311. The organic layer 312 has an organic EL light-emitting element 312*a* arranged for each pixel PX. In addition, the organic layer 312 is provided with a partition wall 312*b* for separating the organic EL light-emitting elements 312*a* between the pixels PX.

The color filter layer 313 is provided on top of the organic layer 312. A color filter 313*a* for performing color display is provided in the color filter layer 313. Specifically, a resin layer colored in R (red), G (green), or B (blue) is provided in each pixel PX as the color filter 313*a*.

The sealing substrate 314 is provided on top of the color filter layer 313. The sealing substrate 314 is a transparent substrate such as a glass substrate and is provided so as to prevent deterioration of the organic EL light-emitting elements of the organic layer 312.

A current which flows through the organic EL light-emitting elements 312*a* of the organic layer 312 changes depending on a display signal supplied to the pixel circuit. Therefore, by supplying each pixel PX with a display signal in accordance with a display image, an amount of emitted light in each pixel PX can be controlled. As a result, a desired image can be displayed.

In an active matrix-type display apparatus such as an organic EL display, one or more TFTs (for example, a switching TFT or a driving TFT) is provided in a single pixel PX. In addition, the TFT of each pixel PX is provided with a semiconductor layer including a source region, a channel region, and a drain region. The polysilicon film according to the present embodiment is suitable for a semiconductor layer in a TFT. In other words, using a polysilicon film manufactured according to the manufacturing method described above in the semiconductor layer of a TFT array substrate enables in-plane variability of TFT characteristics to be suppressed. Therefore, a display apparatus with superior display characteristics can be manufactured with high productivity.

(Method of Manufacturing Semiconductor Apparatus)

Figure 14:
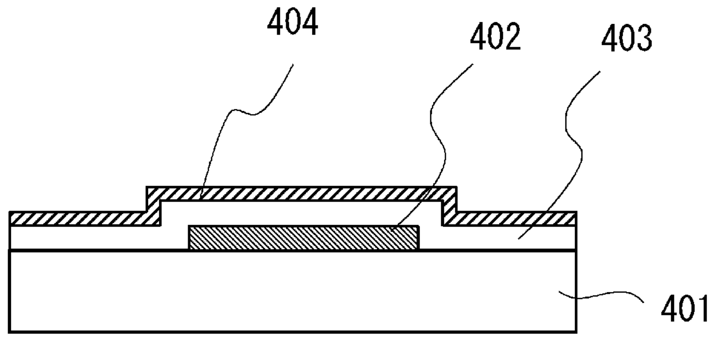
FIG. 14 is a step sectional view showing a method of manufacturing a semiconductor apparatus according to the present embodiment.
Figure 15:
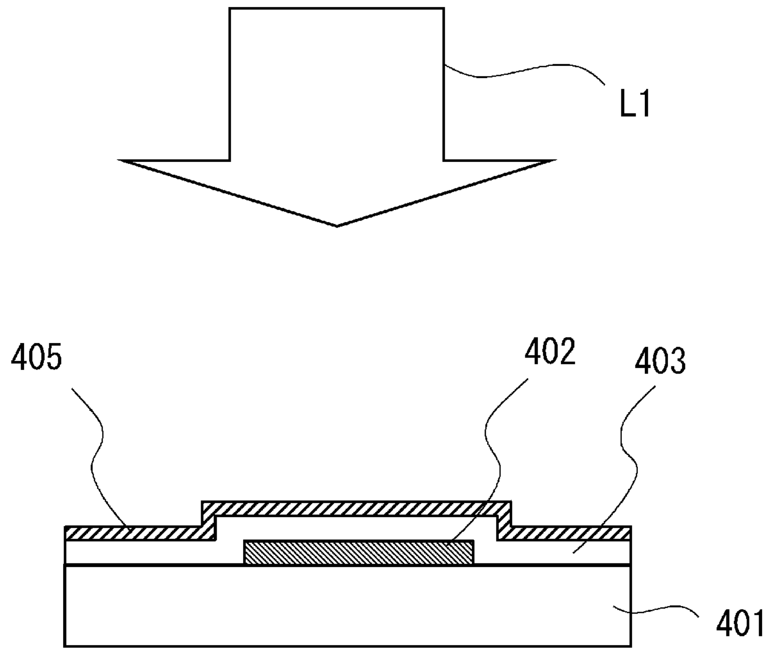
FIG. 15 is a step sectional view showing the method of manufacturing a semiconductor apparatus according to the present embodiment.

A method of manufacturing a semiconductor apparatus using the laser irradiation apparatus according to the present embodiment is suitable for manufacturing a TFT array substrate. A method of manufacturing a semiconductor apparatus including a TFT will be described with reference to FIGS. 14 and 15. FIGS. 14 and 15 are step sectional views showing steps of manufacturing a semiconductor apparatus. Hereinafter, a method of manufacturing a semiconductor apparatus including an inverted staggered-type TFT will be described. FIGS. 14 and 15 show steps of forming a polysilicon film in a method of manufacturing a semiconductor. Since known methods can be used for other manufacturing steps, descriptions thereof will be omitted.

As shown in FIG. 14, a gate electrode 402 is formed on a glass substrate 401. A gate insulator film 403 is formed on the gate electrode 402. An amorphous silicon film 404 is formed on top of the gate insulator film 403. The amorphous silicon film 404 is arranged so as to overlap with the gate electrode 402 via the gate insulator film 403. For example, the gate insulator film 403 and the amorphous silicon film 404 are consecutively formed by a CVD (chemical vapor deposition) method.

In addition, by irradiating the amorphous silicon film 404 with the laser light L1, a polysilicon film 405 is formed as shown in FIG. 15. In other words, the amorphous silicon film 404 is crystallized by the laser irradiation apparatus 1 shown in FIG. 1 and the like. Accordingly, the polysilicon film 405 of crystallized silicon is formed on top of the gate insulator film 403. The polysilicon film 405 corresponds to the polysilicon film 101*b* described above.

Furthermore, while a description of the laser annealing apparatus according to the present embodiment irradiating an amorphous silicon film with laser light and forming a polysilicon film has been given above, alternatively, the amorphous silicon film may be irradiated with laser light to form a microcrystal silicon film. Moreover, the laser light used to perform annealing is not limited to an Nd:YAG laser. In addition, the method according to the present embodiment can also be applied to a laser annealing apparatus which crystallizes thin films other than a silicon film. In other words, the method according to the present embodiment is applicable as long as the laser annealing apparatus irradiates an amorphous film with laser light and forms a crystallized film. With the laser annealing apparatus according to the present embodiment, a substrate with a crystallized film can be suitably modified.

While an invention made by the present inventors has been described using specific terms based on an embodiment, it is to be understood that the present invention is not limited to the embodiment described above and that various changes and modifications may be made without departing from the spirit and scope of the invention.

The present application claims priority on the basis of Japanese Patent Application No. 2020-187793 filed on Nov. 11, 2020, the entire contents of which are incorporated herein by reference.

REFERENCE SIGNS LIST

1 LASER IRRADIATION APPARATUS
10 LIGHT SOURCE
20 OPTICAL MODULE
21 OPTICAL ENCLOSURE
22 MIRROR
23 SEALING WINDOW
30 SEALED PORTION
31 SEALING ENCLOSURE
33 SEALING WINDOW
34 GAS INLET
35 GAS OUTLET
37 GAS
40 TREATMENT CHAMBER
41 GAS BOX
42 INTRODUCING WINDOW
43 IRRADIATING WINDOW
44 GAS INLET
45 SUBSTRATE STAGE
46 BASE
47 SCANNING APPARATUS
48 FOUNDATION
49 CONVEYANCE DIRECTION
51 BLOCKING PLATE
52 BLOCKING PLATE
54 SLIT
55 SLIT
57 REFLECTING MIRROR
58 HEAT INSULATOR
60 BEAM DAMPER
201 GLASS SUBSTRATE
202 GATE ELECTRODE
203 GATE INSULATOR FILM
204 AMORPHOUS SILICON FILM
205 POLYSILICON FILM
206 INTERLAYER INSULATOR FILM
207*a* SOURCE ELECTRODE
207*b* DRAIN ELECTRODE
300 ORGANIC EL DISPLAY
310 SUBSTRATE
311 TFT LAYER
311*a* TFT
312 ORGANIC LAYER
312*a* ORGANIC EL LIGHT-EMITTING ELEMENT
312*b* PARTITION WALL
313 COLOR FILTER LAYER
313*a* COLOR FILTER
314 SEALING SUBSTRATE
C1 OPTICAL AXIS
L1 LASER LIGHT
M1 SUBSTRATE
R1 REFLECTED LIGHT
R2 REFLECTED LIGHT
R3 REFLECTED LIGHT
600 TRAPPING STRUCTURE
601 INTERNAL SPACE
610 MEMBER
611 COOLING TUBE
612 COOLING TUBE
620 MEMBER
621 COOLING TUBE
622 COOLING TUBE
625 COVER
626 FIXTURE
630 EAVES PORTION
631 OPENING PORTION
632 REFLECTION SURFACE
640 OPPOSING PORTION
641 UPPER REFLECTION SURFACE
642 LOWER REFLECTION SURFACE
645 PROJECTING PORTION
650 TERMINAL PORTION
651 REFLECTION SURFACE
655 RECESSED PORTION
660 LIGHT ABSORBING ELEMENT
661 SHEET
662 LEAF SPRING

The invention claimed is:

1. A laser irradiation apparatus comprising:

an optical module configured to irradiate an object with laser light; and a beam damper configured to absorb reflected light having been reflected by the object, the reflected light being the laser light which has been reflected by the object, wherein the beam damper includes a first member and a second member fixed so as to oppose the first member, the first member includes an eaves portion to which the reflected light is incident, and the eaves portion has a reflection surface configured to reflect, toward an internal space enclosed by the first member and the second member, reflected light having been reflected by the object, wherein the beam damper is provided with a light absorbing element which is arranged facing the internal space and which is configured to absorb the reflected light, wherein the beam damper further includes:

a terminal portion provided with the light absorbing element; and an opposing portion arranged between the eaves portion and the terminal portion, the opposing portion is provided with an upper reflection surface and a lower reflection surface which opposes the upper reflection surface, and at least a part of reflected light having been reflected by the reflection surface of the eaves portion is reflected by the upper reflection surface and the lower reflection surface and is incident to the light absorbing element, wherein the terminal portion includes a recessed portion which is further depressed toward a side of the object than the lower reflection surface in an orthogonal direction which is orthogonal to a main surface of the object, and the light absorbing element is arranged in the recessed portion.

2. The laser irradiation apparatus according to claim 1, wherein the reflection surface provided in the eaves portion is a concave surface.

3. The laser irradiation apparatus according to claim 1, further comprising a blocking plate in which a slit through which the laser light passes is formed.

4. The laser irradiation apparatus according to claim 3, wherein the eaves portion includes an opening portion through which the reflected light passes, and reflected light from the blocking plate is incident to the internal space of the beam damper via the opening portion.

5. The laser irradiation apparatus according to claim 4, further comprising a sealing enclosure configured to house the blocking plate and the beam damper.

6. The laser irradiation apparatus according to claim 1, wherein surfaces of the first member and the second member which face the internal space are configured to absorb a part of the incident reflected light.

7. A laser irradiation apparatus comprising:

an optical module configured to irradiate an object with laser light; and a beam damper configured to absorb reflected light having been reflected by the object, the reflected light being the laser light which has been reflected by the object, wherein the beam damper includes a first member and a second member fixed so as to oppose the first member, the first member includes an eaves portion to which the reflected light is incident, and the eaves portion has a reflection surface configured to reflect, toward an internal space enclosed by the first member and the second member, reflected light having been reflected by the object, wherein the first member and the second member are provided with a cooling tube.

8. A method of manufacturing a semiconductor apparatus, comprising the steps of:

(A) emitting laser light from an optical module toward a substrate on which a film including a semiconductor is formed;

(B) irradiating the substrate with the laser light; and (C) causing a beam damper to receive reflected light, the reflected light being the laser light which has been reflected by the substrate, wherein the beam damper includes a first member and a second member fixed so as to oppose the first member, the first member includes an eaves portion to which the reflected light is incident, and the eaves portion has a reflection surface configured to reflect, toward an internal space enclosed by the first member and the second member, reflected light having been reflected by the substrate, wherein the beam damper is provided with a light absorbing element which is arranged facing the internal space and which absorbs the reflected light, wherein the beam damper further includes:

a terminal portion provided with the light absorbing element; and an opposing portion arranged between the eaves portion and the terminal portion, the opposing portion is provided with an upper reflection surface and a lower reflection surface which opposes the upper reflection surface, and at least a part of reflected light having been reflected by the reflection surface of the eaves portion is reflected by the upper reflection surface and the lower reflection surface and is incident to the light absorbing element, wherein the terminal portion includes a recessed portion which is further depressed toward a side of the object than the lower reflection surface in an orthogonal direction which is orthogonal to a main surface of the substrate, and the light absorbing element is arranged in the recessed portion.

9. The method of manufacturing a semiconductor apparatus according to claim 8, wherein the reflection surface provided in the eaves portion is a concave surface.

10. The method of manufacturing a semiconductor apparatus according to claim 8, wherein the laser light is caused to pass through a slit formed in a blocking plate, and the substrate is irradiated with the laser light having passed through the slit.

11. The method of manufacturing a semiconductor apparatus according to claim 10, wherein the eaves portion includes an opening portion through which the reflected light passes, and reflected light from the blocking plate is incident to the internal space of the beam damper via the opening portion.

12. The method of manufacturing a semiconductor apparatus according to claim 11, wherein the blocking plate and the beam damper are housed in a sealing enclosure.

13. The method of manufacturing a semiconductor apparatus according to claim 8, wherein surfaces of the first member and the second member which face the internal space absorb a part of the incident reflected light.

14. A method of manufacturing a semiconductor apparatus, comprising the steps of:

(A) emitting laser light from an optical module toward a substrate on which a film including a semiconductor is formed;

(B) irradiating the substrate with the laser light; and (C) causing a beam damper to receive reflected light, the reflected light being the laser light which has been reflected by the substrate, wherein the beam damper includes a first member and a second member fixed so as to oppose the first member, the first member includes an eaves portion to which the reflected light is incident, and the eaves portion has a reflection surface configured to reflect, toward an internal space enclosed by the first member and the second member, reflected light having been reflected by the substrate, wherein the first member and the second member are provided with a cooling tube.

* * * * *